United States Patent
Farrell, Jr. et al.

(10) Patent No.: US 9,231,376 B2
(45) Date of Patent: *Jan. 5, 2016

(54) TECHNIQUE FOR THE GROWTH AND FABRICATION OF SEMIPOLAR (GA,AL,IN,B)N THIN FILMS, HETEROSTRUCTURES, AND DEVICES

(71) Applicant: The Regents of the University of California, Oakland, CA (US)

(72) Inventors: Robert M. Farrell, Jr., Goleta, CA (US); Troy J. Baker, Raleigh, NC (US); Arpan Chakraborty, Goleta, CA (US); Benjamin A. Haskell, San Marcos, CA (US); P. Morgan Pattison, Morgantown, WV (US); Rajat Sharma, Singapore (SG); Umesh K. Mishra, Montecito, CA (US); Steven P. DenBaars, Goleta, CA (US); James S. Speck, Goleta, CA (US); Shuji Nakamura, Santa Barbara, CA (US)

(73) Assignees: The Regents of the University of California, Oakland, CA (US); Japan Science and Technology Agency, Kawaguchi, Saitama Prefecture (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/229,674

(22) Filed: Mar. 28, 2014

(65) Prior Publication Data
US 2014/0211820 A1    Jul. 31, 2014

Related U.S. Application Data

(63) Continuation of application No. 12/953,029, filed on Nov. 23, 2010, now Pat. No. 8,686,466, which is a continuation of application No. 11/444,946, filed on Jun. 1, 2006, now Pat. No. 7,846,757.

(60) Provisional application No. 60/686,244, filed on Jun. 1, 2005.

(51) Int. Cl.
   *H01L 33/30* (2010.01)
   *H01S 5/343* (2006.01)
   (Continued)

(52) U.S. Cl.
   CPC ............. *H01S 5/34333* (2013.01); *B82Y 20/00* (2013.01); *C30B 23/025* (2013.01); *C30B 25/18* (2013.01);
   (Continued)

(58) Field of Classification Search
   CPC ..................... H01L 21/02609; H01L 21/0254; H01L 21/02458; H01L 33/007; H01L 21/02433; H01L 21/02389; H01L 33/0062
   USPC .............. 257/103, 79, 86, E33.003, E33.013, 257/E33.023, E21.113, E21.463; 438/22, 438/46, 47
   See application file for complete search history.

(56) References Cited

U.S. PATENT DOCUMENTS 5,006,908 A    4/1991   Matsuoka et al.
5,959,316 A *  9/1999   Lowery .......................... 257/98

(Continued)

FOREIGN PATENT DOCUMENTS

EP    0383215    8/1990
EP    1385196    1/2004

(Continued)

OTHER PUBLICATIONS

Kamiyama et al., "GaN growth on (30-38) 4H—SiC substrate for reduction of internal polarization." Physica Status Solidi vol. 2, No. 7 (2005): pp. 2121-2124.*

(Continued)

*Primary Examiner* — Michele Fan
(74) *Attorney, Agent, or Firm* — Gates & Cooper LLP

(57) ABSTRACT

A method for growth and fabrication of semipolar (Ga,Al,In,B)N thin films, heterostructures, and devices, comprising identifying desired material properties for a particular device application, selecting a semipolar growth orientation based on the desired material properties, selecting a suitable substrate for growth of the selected semipolar growth orientation, growing a planar semipolar (Ga,Al,In,B)N template or nucleation layer on the substrate, and growing the semipolar (Ga,Al,In,B)N thin films, heterostructures or devices on the planar semipolar (Ga,Al,In,B)N template or nucleation layer. The method results in a large area of the semipolar (Ga,Al,In,B)N thin films, heterostructures, and devices being parallel to the substrate surface.

31 Claims, 20 Drawing Sheets

(51) Int. Cl.

| | | |
|---|---|---|
| *B82Y 20/00* | (2011.01) | |
| *C30B 23/02* | (2006.01) | |
| *C30B 25/18* | (2006.01) | |
| *C30B 29/40* | (2006.01) | |
| *H01L 21/02* | (2006.01) | |
| *H01L 33/00* | (2010.01) | |
| *H01S 5/042* | (2006.01) | |
| *H01S 5/22* | (2006.01) | |
| *H01S 5/32* | (2006.01) | |

(52) U.S. Cl.
CPC .......... *C30B 29/403* (2013.01); *H01L 21/0242* (2013.01); *H01L 21/0254* (2013.01); *H01L 21/02433* (2013.01); *H01L 21/02458* (2013.01); *H01L 21/02609* (2013.01); *H01L 33/007* (2013.01); *H01L 21/02389* (2013.01); *H01L 33/0062* (2013.01); *H01S 5/0422* (2013.01); *H01S 5/2201* (2013.01); *H01S 5/3202* (2013.01); *H01S 2304/04* (2013.01)

(56) References Cited

U.S. PATENT DOCUMENTS

| | | | |
|---|---|---|---|
| 6,153,010 A | 11/2000 | Kiyoku et al. | |
| 6,218,280 B1 | 4/2001 | Kryliouk et al. | |
| 6,316,785 B1 | 11/2001 | Nunoue et al. | |
| 6,440,823 B1 | 8/2002 | Vaudo et al. | |
| 6,576,932 B2 | 6/2003 | Khare et al. | |
| 6,586,819 B2 | 7/2003 | Matsuoka | |
| 6,599,362 B2 | 7/2003 | Ashby et al. | |
| 6,639,925 B2 | 10/2003 | Niwa et al. | |
| 6,773,504 B2 | 8/2004 | Motoki et al. | |
| 6,847,057 B1 | 1/2005 | Gardner et al. | |
| 6,924,512 B2 | 8/2005 | Tsuda et al. | |
| 7,009,215 B2 | 3/2006 | D'Evelyn et al. | |
| 7,091,514 B2 | 8/2006 | Craven et al. | |
| 7,129,525 B2 | 10/2006 | Uematsu et al. | |
| 7,186,302 B2 | 3/2007 | Chakraborty et al. | |
| 7,220,324 B2 | 5/2007 | Baker et al. | |
| 7,361,576 B2 | 4/2008 | Imer et al. | |
| 7,575,947 B2 | 8/2009 | Iza et al. | |
| 7,687,293 B2 | 3/2010 | Sato et al. | |
| 7,691,658 B2 | 4/2010 | Kaeding et al. | |
| 7,704,331 B2 | 4/2010 | Baker et al. | |
| 7,723,216 B2 | 5/2010 | Chakraborty et al. | |
| 7,781,314 B2 | 8/2010 | Kyono et al. | |
| 7,846,757 B2 | 12/2010 | Farrell, Jr. et al. | |
| 8,128,756 B2 | 3/2012 | Baker et al. | |
| 2002/0031153 A1* | 3/2002 | Niwa et al. ................. | 372/45 |
| 2002/0069817 A1* | 6/2002 | Mishra et al. ............... | 117/84 |
| 2002/0074561 A1 | 6/2002 | Sawaki et al. | |
| 2002/0144645 A1 | 10/2002 | Kim et al. | |
| 2003/0015708 A1 | 1/2003 | Parikh et al. | |
| 2003/0024475 A1 | 2/2003 | Anderson | |
| 2003/0178702 A1 | 9/2003 | Sawaki et al. | |
| 2003/0198837 A1 | 10/2003 | Craven et al. | |
| 2003/0230235 A1 | 12/2003 | Craven et al. | |
| 2004/0238810 A1 | 12/2004 | Dwilinski et al. | |
| 2004/0245535 A1 | 12/2004 | D'Evelyn et al. | |
| 2004/0251471 A1 | 12/2004 | Dwilinski et al. | |
| 2004/0261692 A1 | 12/2004 | Dwilinski et al. | |
| 2005/0040385 A1 | 2/2005 | Craven et al. | |
| 2005/0142391 A1 | 6/2005 | Dmitriev et al. | |
| 2005/0161697 A1 | 7/2005 | Nakahata et al. | |
| 2005/0161772 A1 | 7/2005 | Suzuki | |
| 2005/0214992 A1 | 9/2005 | Chakraborty et al. | |
| 2005/0218411 A1* | 10/2005 | Armitage et al. ............. | 257/78 |
| 2005/0242357 A1* | 11/2005 | Uematsu et al. ............. | 257/94 |
| 2005/0242364 A1* | 11/2005 | Moustakas et al. .......... | 257/103 |
| 2005/0258451 A1 | 11/2005 | Saxler et al. | |
| 2006/0008941 A1 | 1/2006 | Haskell et al. | |
| 2006/0138431 A1 | 6/2006 | Dwilinski et al. | |
| 2006/0174815 A1* | 8/2006 | Butcher et al. .............. | 117/2 |
| 2007/0015345 A1 | 1/2007 | Baker et al. | |
| 2007/0022940 A1 | 2/2007 | Boussagol et al. | |
| 2007/0093073 A1 | 4/2007 | Farrell, Jr. et al. | |
| 2007/0111531 A1 | 5/2007 | Baker et al. | |
| 2007/0190758 A1 | 8/2007 | Kaeding et al. | |
| 2007/0218703 A1 | 9/2007 | Kaeding et al. | |
| 2007/0252164 A1 | 11/2007 | Zhong et al. | |
| 2008/0163814 A1 | 7/2008 | Kim et al. | |
| 2008/0179607 A1 | 7/2008 | DenBaars et al. | |
| 2008/0224268 A1 | 9/2008 | Abe et al. | |
| 2008/0230766 A1 | 9/2008 | Okamoto et al. | |
| 2008/0308825 A1* | 12/2008 | Chakraborty et al. .......... | 257/98 |
| 2009/0072353 A1 | 3/2009 | Hirai et al. | |
| 2009/0081857 A1 | 3/2009 | Hanser et al. | |
| 2009/0134410 A1 | 5/2009 | Paek et al. | |
| 2009/0146162 A1 | 6/2009 | Chakraborty et al. | |
| 2009/0146185 A1 | 6/2009 | Suh et al. | |
| 2009/0155947 A1 | 6/2009 | Paek et al. | |
| 2009/0168453 A1 | 7/2009 | Koike et al. | |
| 2009/0250686 A1 | 10/2009 | Sato et al. | |
| 2009/0310640 A1 | 12/2009 | Sato et al. | |
| 2010/0108985 A1 | 5/2010 | Chung et al. | |

FOREIGN PATENT DOCUMENTS

| | | |
|---|---|---|
| GB | 2416623 | 2/2006 |
| JP | 02-211620 | 8/1990 |
| JP | 7130657 | 5/1995 |
| JP | 8330630 | 12/1996 |
| JP | 10-341060 | 12/1998 |
| JP | 2000203995 | 7/2000 |
| JP | 2002222990 | 8/2002 |
| JP | 2003209062 | 7/2003 |
| JP | 2004273484 | 9/2004 |
| JP | 2004273661 | 9/2004 |
| WO | 03/089694 | 10/2003 |

OTHER PUBLICATIONS

Van Zant, Microchip Fabrication, Fifth Edition, New York: McGraw-Hill, 2004, pp. 384-385.*

Kim et al., "Performance of High-Power AlInGaN Light Emitting Diodes" Phys. Stat. Sol, 188, 1 (2001): pp. 15-21.*

"Visible and Ultraviolet Spectroscopy", Michigan State University, Department of Chemistry, http://www2.chemistry.msu.edu/faculty/reusch/VirtTxtJml/Spectrpy/UV-Vis/spectrum.htm (2013).*

"Terminology: LED Efficiency", LEDs Magazine, http://www.ledsmagazine.com/articles/2004/01/terminology-led-efficiency.html (date unknown, but data sheet retrieved from website on 2014).*

"Surface-emitting Semiconductor Lasers", RP Photonics Encyclopedia, http://www.rp-photonics.com/surface_emitting_semiconductor_lasers.html (date unknown, information retrieved from website on 2014).*

Rozhansky et al., "Analysis of dependence of electroluminescence efficiency of AlInGaN LED heterostructures on pumping" Phys. Stat. Sol, 3, 6 (May 29, 2006): pp. 2160-2164.*

Mukai et al., "Characteristics of InGaN-Based UV/Blue/Green/Amber/Red Light-Emitting Diodes" Japanese Journal of Applied Physics, 38 (1999): pp. 3976-3981.*

Chakraborty et al., "Milliwatt power blue InGaN/GaN Light-Emitting Dioes on Semipolar GaN Templates" Japanese Journal of Applied Physics, 44 (Jul. 2005): pp. L945-L947.*

European Search Report dated Aug. 3, 2010 for EP App. No. 06771738.9.

Japanese Office Action dated Oct. 18, 2011 for JP App. No. 2008-514810.

Japanese Office Action (with English translation) dated Jan. 22, 2013 for JP App. No. 2008-514810.

Japanese Office Action (with English translation) dated Sep. 24, 2013 for JP App. No. 2008-514810.

Korean Office Action dated Jul. 31, 2012 for KR App. No. 10-2007-7030909, with English translation.

Korean Office Action dated Jun. 5, 2013 for KR App. No. 10-2007-7030909.

International Search Report and Written Opinion mailed on Sep. 10, 2007 for PCT App. No. PCT/US2006/21128.

(56) References Cited

OTHER PUBLICATIONS

Taiwanese Office Action dated Sep. 20, 2012 for TW App. No. 095119443, with English translation.
Taiwanese Office Action dated Aug. 22, 2013 for TW App. No. 095119443.
Aminer et al., "Single-crystl hexagonal and cubic GaN growth directly on vicinal (001) GaAs substrates by molecular-beam epitaxy," Applied Physics Letters, vol. 76, No. 18 (2000), pp. 2580-2582.
Baker et al., "Characterization of Planar Semipolar Gallium Nitride Films on Spinel Substrates", Japanese Journal of Applied Physics, vol. 44, No. 29, 2005, pp. L920-L922.
Baker, T., et al., "Characterization of Planar Semipolar Gallium Nitride Films on Sapphire Substrates", Japanese Journal of Applied Physics, vol. 45, No. 6, 2006, pp. L154-L157.
Bauer, J. et al., "Optical properties of aluminum nitride prepared by chemical and plasmachemical vapour deposition," Physica Status Solidi (A), vol. 39, Jan. 16, 1977, pp. 173-181.
Bernardini, F. et al., "Spontaneous polarization and piezoelectric constants of III-V nitrides," Physical Review B, vol. 56, No. 16, R10 024-R10-027, Oct. 15, 1997.
Bertram, A. et al., "Strain relaxation and strong impurity incorporation in epitaxial laterally overgrown GaN: direct imaging of different growth domains by cathodoluminescence microscopy and micro-Raman spectroscopy," Appl. Phys. Lett. 74(3):359-361, 1999.
Chakraborty, A. et al., "Nonpolar InGaN/GaN emitters on reduced-defect lateral epitaxially overgrown a-plane GaN with drive-current-independent electroluminescence emission peak," Appl. Phys. Lett., 85(22):5143-5145, 2004.
Chakraborty, A. et al., "Demonstration of nonpolar m-plane InGaN/GaN light-emitting diodes on free-standing m-plane GaN substrates," Jpn. J. Appl. Phys., 44(5):L173-L175, 2005.
Chakraborty, A. et al., "Milliwatt power blue InGaN/GaN light-emitting diodes on semipolar GaN templates," Japanese Journal of Applied Physics, vol. 44, No. 30, 2005, pp. L945-L947.
Chakraborty, A. et al., "Properties of nonpolar a-plane InGaN/GaN multiple quantum wells grown on lateral epitaxially overgrown a-plane GaN," Appl. Phys. Lett., 86, pp. 031901-1-031901-3, 2005.
Chitnis, A. et al., "Visible light-emitting diodes using a-plane GaN—InGaN multiple quantum wells over r-plane sapphire," Appl. Phys. Lett., 84(18):3663-3665, 2004.
Della Sala, F. et al., "Free-carrier screening of polarization fields in wurtzite GaN/InGaN laser structures," Appl. Phys. Lett., 74(14):2002-2005, 1999.
Di Carlo, A. et al., "Doping screening of polarization fields in nitride heterostructures," Appl. Phys. Lett., 76 (26):3950-3952, 2000.
Funato et al., "Blue, green, and amber InGaN/GaN light-emitting diodes on semipolar {11-22} GaN bulk substrates," Jap. Journal of Appl. Phys., vol. 45, No. 26, 2006, pp. L659-L662.
Gardner, N. et al., "Polarization anisotropy in the electroluminescence of m-plane InGaN—GaN multiple-quantum-well light-emitting diodes," Appl. Phys. Lett., 86, 111101-1-111101-3, 2005.
George, T., et al., "Novel symmetry in the growth of gallium nitride on magnesium aluminate substrates", Applied Physics Letters, AIP, American Institute of Physics, Melville, NY, US LNKD-DOI:10.1063/1.116708, vol. 68, No. 3, Jan. 15, 1996, pp. 337-339, XP012015623.
Grandjean, N. et al., "Built-in electric-field effects in wurtzite AlGaN/GaN quantum wells," J. Appl. Phys., 86(7), 3714-3720, 1999.
Gu et al., "The impact of initial growth of substrate nitridation on thick GaN growth on sapphire by hydride vapor phase epitaxy," Journal of Crystal Growth, vol. 231, No. 3, Oct. 2001, pp. 342-351.
Hwang, J. et al., "Heteroepitaxy of gallium nitride on (0001), (10$\bar{1}$2) and (10$\bar{1}$0) sapphire surfaces," Journal of Crystal Growth 142 (1994) 5-14.
Ilegems, M., "Vapor epitaxy of gallium nitride," Journal of Crystal Growth, vol. 13/14, May 1, 1972, pp. 360-364.

Im, J. et al., "Reduction of oscillator strength due to piezoelectric fields in GaN/AlxGa1-xN quantum wells," Phys. Rev. B, 57(16):R9435-R9438, 1998.
Iwaya, M., et al., "Reduction of etch pit density in organometallic vapor phase epitaxy-grown GaN on sapphire by insertion of a low-temperature-deposited buffer layer between high-temperature-grown GaN", Mar. 15, 1998, Japanese Journal of Applied Physics Part 2, pp. L316-L318, XP009110309.
Kamiyama et al., "GaN growth on (30$\bar{3}$8) 4H—SiC substrate for reduction of internal polarization". Phys. Stat. Sol. (c) 2, No. 7 (2005), pp. 2121-2124.
Kim, K. et al., "Elastic constants and related properties of tetrahedrally bonded BN, AlN, GaN, and InN," Phys. Rev. B, 53(24):16 310-16 325, 1996.
"Kyma Technologies announces improved and expanded native gallium nitride product line," Mar. 20, 2006, Company News Release, retrieved from http://www.compoundsemi.com/documents/articles/cldoc/6524.html.
Lefebvre, P. et al, "High internal electric field in graded-width InGaN/GaN quantum well accurate determination by time spectroscopy," Appl. Phys. Lett., 78(9):1252-1254, 2001.
Matsuoka, T. et al., "GaN growth on novel lattice-matching substrate: tilted m-plane sapphire," Phys. Stat. Sol. (a) 188, No. 2 (2001), 485-489.
McMahan, "Dr. Shuji Nakamura and UCSB research team report first nonpolar and semi-polar GaN LEDs," Compoundsemi Online, Mar. 24, 2006, one page.
Miskys, C.R. et al., "Freestanding GaN-substrates and devices", Physica Status Solidi (C), Wiley-VCH Verlag, Berlin, DE LNKD-DOI:10.1002/PSSC.200303140, No. 6, Sep. 1, 2003, pp. 1627-1650, XP009119960 ISSN: 1610-1634.
Nakamura, S. et al., "InGaN/GaN/AlGaN-based laser diodes with modulation-doped strained-layer superlattices grown on an epitaxially laterally overgrown GaN substrate," Appl. Phys. Lett., 72(2):211-213, 1998.
Neubert, "Growth characteristics of GaInN quantum wells on semipolar GaN facets," Annual Report 2005, Optoelectronics Department, University of Ulm, 2006, pp. 1-6.
Nishizuka, K., "Efficient Radiative Recombination From <11$\bar{2}$2>-oriented InxGa1—xN Multiple Quantum Wells Fabricated by the Regrowth Technique," Applied Physics Letters, Oct. 2004, vol. 85, No. 15, pp. 3122-3124, abstract.
Patent Abstracts of Japan, vol. 2002, No. 04, Aug. 4, 2002 & JP 2001 342100 A (Toshiba Corp.), Dec. 11, 2001.
Park, S. et al., "Crystal-orientation effects on the piezoelectric field and electronic properties of strained wurtzite semiconductors," Phys. Rev. B, 59(7):4725-4737, 1999.
Park, S., "Crystal orientation effects on electronic properties of wurtzite InGaN/GaN quantum wells," J. Appl. Phys., 91(12):9904-9908, 2002.
Park, S. et al., "Crystal orientation effects on many-body optical gain of wurtzite InGan/GaN quantum well lasers," Japanese Journal of Applied Physics, vol. 42 (2003), pp. L170-L172.
Park, S., "Piezoelectric and spontaneous polarization effects on many-body optical gain of wurtzite InGaN/GaN quantum well with arbitrary crystal orientation," Jpn. J. Appl., 42(8):5052-5055, 2003.
Polian, M. et al., "Elastic constants of gallium nitride," J. Appl. Phys., 79(6):3343-3344, 1996.
Shao, Y. et al., "Electrical characterization of semipolar gallium nitride thin films," NNIN REU Research Accomplishments, Aug. 2005, pp. 132-133.
Sharma, R., "Demonstration of a Semipolar (10$\bar{1}$3) InGaN/GaN Green Light Emitting Diode," Applied Physics Letters, Nov. 2005, vol. 87, 231110, pp. 1-3, abstract.
Sone, H. et al., "Optical and crystalline properties of epitaxial-lateral-overgrown-GaN using tungsten mask by hydride vapor phase epitaxy," Jpn. J. Appl. Phys., 38(4A):L356-L359, 1999.
Sun, Y. et al., "Nonpolar InxGa1-x N/GaN(1$\bar{1}$00) multiple quantum wells grown on y-LiAlO2(100) by plasma-assisted molecular-beam epitaxy," Phys. Rev. B, 67:041306-1-041306-4, 2003.
Suzuki, M. et al., "Biaxial strain effect on wurtzite GaN/AlGaN quantum well lasers," Jpn. J. Appl. Phys., 35 (2B):1420-1423, 1996.

(56) References Cited

OTHER PUBLICATIONS

Takeuchi, T. et al., "Quantum-confined stark effect due to piezoelectric fields in GaInN strained quantum wells," Jpn. J. Appl. Phys., 36(4A):L382-L385, 1997.

Takeuchi, T. et al., "Determination of piezoelectric fields in strained GaInN quantum wells using the quantum-confined Stark effect," Appl. Phys. Lett., 73(12):1691-1693, 1998.

Takeuchi, T. et al., "Theoretical study of orientation dependence of piezoelectric effects in wurtzite strained GaInN/GaN heterostructures and quantum wells," Jpn. J. Appl. Phys., 39(2A):413-416, 2000.

Tempel, A., et al., "The epitaxy of gallium nitride on nonstoichiometric spinel from the system GaCl/NH3/He", Kristall Und Technik East Germany, vol. 10, No. 7, Jan. 1, 1975, pp. 747-758, XP002588951.

Vurgaftman, I. et al., "Band parameters for nitrogen-containing semiconductors," J. Appl. Phys., 94(6):3675-3696, 2003.

Yablonovitch, E. et al., "Reduction of lasing threshold current density by the lowering of valence band effective mass," J. Lightwave Tech., LT-4(5):504-506, 1986.

Coldren, L. A., et al., "Diode Lasers and Photonic Integrated Circuits", Wiley Interscience, New York, 1995. [Book].

Nakamura, S., et al., "The Blue Laser Diode: The Complete Story", Springer, Heidelberg, 1997. [Book].

Japanese Notification of Reasons for Refusal and Decision of Dismissal of Amendment (with English translations) dated Aug. 12, 2014 for Japanese Patent Application No. 2008-514810.

\* cited by examiner

TECHNIQUE FOR THE GROWTH AND FABRICATION OF SEMIPOLAR (GA,AL,IN,B)N THIN FILMS, HETEROSTRUCTURES, AND DEVICES

CROSS-REFERENCE TO RELATED APPLICATIONS

This application is a continuation under 35 U.S.C. §120 of co-pending and commonly-assigned U.S. Utility patent application Ser. No. 12/953,029, filed on Nov. 23, 2010, by Robert M. Farrell, Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, and entitled "TECHNIQUE FOR THE GROWTH AND FABRICATION OF SEMIPOLAR (GA, AL,IN,B)N THIN FILMS, HETEROSTRUCTURES, AND DEVICES,", which application is a continuation of commonly-assigned U.S. Utility patent application Ser. No. 11/444,946, filed on Jun. 1, 2006, now U.S. Pat. No. 7,846, 757 issued on Dec. 7, 2010, by Robert M. Farrell, Troy J. Baker, Arpan Chakraborty, Benjamin A. Haskell, P. Morgan Pattison, Rajat Sharma, Umesh K. Mishra, Steven P. Den-Baars, James S. Speck, and Shuji Nakamura, and entitled "TECHNIQUE FOR THE GROWTH AND FABRICATION OF SEMIPOLAR (GA,AL,IN,B)N THIN FILMS, HETEROSTRUCTURES, AND DEVICES,", which application claims the benefit under 35 U.S.C §119(e) of commonly-assigned U.S. Provisional Application Ser. No. 60/686,244, filed on Jun. 1, 2005, by Robert M. Farrell, Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, and entitled "TECHNIQUE FOR THE GROWTH AND FABRICATION OF SEMIPOLAR (Ga,Al,In,B)N THIN FILMS, HETEROSTRUCTURES, AND DEVICES,";

all of which applications are incorporated by reference herein.

This application is also related to the following commonly-assigned applications:

U.S. Utility patent application Ser. No. 10/413,690, now U.S. Pat. No. 7,091,514 issued on Aug. 15, 2006, by Michael D. Craven, Stacia Keller, Steven P. DenBaars, Tal Margalith, James S. Speck, Shuji Nakamura, and Umesh K. Mishra, entitled "NON-POLAR (Al,B,In,Ga)N QUANTUM WELL AND HETEROSTRUCTURE MATERIALS AND DEVICES,", which application claims the benefit under 35 U.S.C. Section 119(e) of U.S. Provisional Patent Application Ser. No. 60/372,909, entitled "NON-POLAR GALLIUM NITRIDE BASED THIN FILMS AND HETEROSTRUCTURE MATERIALS," filed on Apr. 15, 2002, by Michael D. Craven, Stacia Keller, Steven P. DenBaars, Tal Margalith, James S. Speck, Shuji Nakamura, and Umesh K. Mishra;

U. S. Utility patent application Ser. No. 11/123,805, now U.S. Pat. No. 7,186,302 issued on Mar. 6, 2007, by Arpan Chakraborty, Benjamin A. Haskell, Stacia Keller, James S. Speck, Steven P. DenBaars, Shuji Nakamura, and Umesh K. Mishra, entitled "FABRICATION OF NONPOLAR INDIUM GALLIUM NITRIDE THIN FILMS, HETEROSTRUCTURES AND DEVICES BY METALORGANIC CHEMICAL VAPOR DEPOSITION,", which application claims the benefit under 35 U.S.C. Section 119(e) of U.S. Provisional Patent Application Ser. No. 60/569,749, filed on May 10, 2004, by Arpan Chakraborty, Benjamin A. Haskell, Stacia Keller, James S. Speck, Steven P. DenBaars, Shuji Nakamura and Umesh K. Mishra, entitled "FABRICATION OF NONPOLAR InGaN THIN FILMS, HETEROSTRUCTURES AND DEVICES BY METALORGANIC CHEMICAL VAPOR DEPOSITION,"; and U.S. Provisional Patent Application Ser. No. 60/660,283, entitled "TECHNIQUE FOR THE GROWTH OF PLANAR SEMI-POLAR GALLIUM NITRIDE," filed on Mar. 10, 2005, by Troy J. Baker, Benjamin A. Haskell, Paul T. Fini, Steven P. DenBaars, James S. Speck, and Shuji Nakamura;

which applications are incorporated by reference herein.

BACKGROUND OF THE INVENTION

1. Field of the Invention

The present invention is related to semiconductor materials, methods, and devices, and more particularly, to the growth and fabrication of semipolar (Ga,Al,In,B)N thin films, heterostructures, and devices.

2. Description of the Related Art (Note: This application references a number of different publications as indicated throughout the specification by one or more reference numbers within brackets, e.g., [Ref x]. A list of these different publications ordered according to these reference numbers can be found below in the section entitled "References." Each of these publications is incorporated by reference herein.)

The usefulness of gallium nitride (GaN) and alloys of (Ga,Al,In,B)N has been well established for fabrication of visible and ultraviolet optoelectronic devices and high-power electronic devices. As shown in FIG. 1, current state-of-the-art nitride thin films, heterostructures, and devices are grown along the [0001] axis 102 of the würtzite nitride crystal structure 100. The total polarization of such films consists of spontaneous and piezoelectric polarization contributions, both of which originate from the single polar [0001] axis 102 of the würtzite nitride crystal structure 100. When nitride heterostructures are grown pseudomorphically, polarization discontinuities are formed at surfaces and interfaces within the crystal. These discontinuities lead to the accumulation or depletion of carriers at surfaces and interfaces, which in turn produce electric fields. Since the alignment of these built-in electric fields coincides with the typical [0001] growth direction of nitride thin films and heterostructures, these fields have the effect of "tilting" the energy bands of nitride devices.

In c-plane würtzite (Ga,Al,In,B)N quantum wells, the "tilted" energy bands 104 and 106 spatially separate the hole wavefunction 108 and the electron wavefunction 110, as illustrated in FIG. 1. This spatial charge separation reduces the oscillator strength of radiative transitions and red-shifts the emission wavelength. These effects are manifestations of the quantum confined Stark effect (QCSE) and have been thoroughly analyzed for nitride quantum wells [Refs. 1-4]. Additionally, the large polarization-induced fields can be partially screened by dopants and injected carriers [Refs. 5, 6], so the emission characteristics can be difficult to engineer accurately.

Furthermore, it has been shown that pseudomorphic biaxial strain has little effect on reducing effective hole masses in c-plane würtzite (Ga,Al,In,B)N quantum wells [Ref 7]. This is in stark contrast to the case for typical III-V zinc-blende InP- and GaAs-based quantum wells, where anisotropic strain-induced splitting of the heavy hole and light hole bands leads to a significant reduction in the effective hole masses. A reduction in effective hole masses leads to a substantial increase in the quasi-Fermi level separation for any given carrier density in typical III-V zinc-blende InP- and GaAs-based quantum wells. As a direct consequence of this increase in quasi-Fermi level separation, much smaller carrier densities are needed to generate optical gain [Ref 8]. However, in the case of the würtzite nitride crystal structure, the hexagonal symmetry and small spin-orbit coupling of the nitrogen atoms in biaxially strained c-plane nitride quantum wells produces negligible splitting of the heavy hole and light hole bands [Ref 7]. Thus, the effective mass of holes remains much larger than the effective mass of electrons in biaxially strained c-plane nitride quantum wells, and very high carrier densities are needed to generate optical gain.

One approach to eliminating polarization effects and decreasing effective hole masses in (Ga,Al,In,B)N devices is to grow the devices on nonpolar planes of the crystal. These include the $\{11\bar{2}0\}$ planes, known collectively as a-planes, and the $\{1\bar{1}00\}$ planes, known collectively as m-planes. Such planes contain equal numbers of gallium and nitrogen atoms per plane and are charge-neutral. Subsequent non-polar layers are equivalent to one another so the bulk crystal will not be polarized along the growth direction. Moreover, it has been shown that strained nonpolar InGaN quantum wells have significantly smaller hole masses than strained c-plane InGaN quantum wells [Ref 9]. Nevertheless, despite advances made by researchers at the University of California and elsewhere [Refs. 10-15], growth and fabrication of non-polar (Ga,Al,In,B)N devices remains challenging and has not yet been widely adopted in the nitride industry.

Another approach to reducing polarization effects and effective hole masses in (Ga,Al,In,B)N devices is to grow the devices on semipolar planes of the crystal. The term "semipolar plane" can be used to refer to any plane that cannot be classified as c-plane, a-plane, or m-plane. In crystallographic terms, a semipolar plane would be any plane that has at least two nonzero h, i, or k Miller indices and a nonzero l Miller index.

Growth of semipolar (Ga,Al,In,B)N thin films and heterostructures has been demonstrated on the sidewalls of patterned c-plane oriented stripes [Ref 16]. Nishizuka et al. have grown $\{11\bar{2}2\}$ InGaN quantum wells by this technique. However, this method of producing semipolar nitride thin films and heterostructures is drastically different than that of the current disclosure; it is an artifact of epitaxial lateral overgrowth (ELO). The semipolar facet is not parallel to the substrate surface and the available surface area is too small to be processed into a semipolar device.

The present invention describes a method for the growth and fabrication of semipolar (Ga,Al,In,B)N thin films, heterostructures, and devices on suitable substrates or planar (Ga,Al,In,B)N templates in which a large area of the semipolar film is parallel to the substrate surface. In contrast to the micrometer-scale inclined-facet growth previously demonstrated for semipolar nitrides, this method should enable large-scale fabrication of semipolar (Ga,Al,In,B)N devices by standard lithographic methods.

Compared with zinc-blende InP- and GaAs-based quantum well heterostructures and devices, würtzite c-plane (Ga,Al,In,B)N quantum well heterostructures and devices require higher carrier densities to generate optical gain. This can be attributed to the presence of large polarization-induced electric fields and inherently large effective hole masses [Refs. 17, 18]. Therefore, reduction of built-in electric fields and effective hole masses is essential for the realization of high-performance (Ga,Al,In,B)N devices.

The design of typical InP- and GaAs-based heterostructure devices usually involves varying thin film parameters such as composition, thickness, and strain. By varying these parameters, it is possible to change the electronic and optical properties of individual epitaxial layers, such as bandgap, dielectric constant, and effective hole mass. Although not typically employed in InP- and GaAs-based device design, altering the crystal growth orientation can also affect the electronic and optical properties of individual epitaxial layers. In particular, altering the crystal growth orientation can reduce polarization effects and effective hole masses in nitride thin films and heterostructures. To accommodate this novel design parameter, we have invented a method for the growth and fabrication of semipolar (Ga,Al,In,B)N thin films, heterostructures, and devices. By properly selecting the correct substrate or semipolar template for crystal growth, the optimum combination of net polarization and effective hole mass can be chosen to suit a particular device application.

As an illustration of the effects of altering the crystal growth orientation, the piezoelectric polarization can be calculated and plotted as a function of the angle between a general growth direction and the c-axis for compressively strained $In_xGa_{1-x}N$ quantum wells [Refs. 9, 18-20]. FIG. 2 shows the relationship between the conventional coordinate system (x, y, z) for c-plane crystal growth and a new coordinate system (x', y', z') for a general crystal growth orientation. The conventional coordinate system (x, y, z) can be transformed into the new coordinate system (x', y', z') by using a rotation matrix, $$U = \begin{pmatrix} \cos\theta\cos\phi & \cos\theta\sin\phi & -\sin\theta \\ -\sin\phi & \cos\phi & 0 \\ \sin\theta\cos\phi & \sin\theta\sin\phi & \cos\theta \end{pmatrix} \quad (1)$$

where $\phi$ and $\theta$ represent the azimuthal and polar angles of the new coordinate system relative to the [0001] axis, respectively. As shown in FIG. 2, the z-axis corresponds to the [0001] axis 102 and the z'-axis 200 corresponds to the new general crystal growth axis. For calculating physical parameters, dependence on the azimuthal angle ($\phi$) 202 can be neglected because the piezoelectric effect in würtzite materials shows monoaxial isotropic behavior along the [0001] axis [Ref 21]. Thus, a family of equivalent semipolar planes can be uniquely represented by a single polar angle ($\theta$) 204, referred to hereafter as simply the crystal angle 204. The crystal angles 204 for polar, non-polar, and a few selected semipolar planes are shown in Table 1 below.

TABLE 1

List of polar, non-polar, and selected semipolar planes with corresponding crystal angles.

| Plane | Crystal Angle ($\theta$) |
|---|---|
| $\{0001\}$ | 0° |
| $\{10\bar{1}4\}$ | 25.1° |
| $\{10\bar{1}3\}$ | 32.0° |
| $\{10\bar{1}2\}$ | 43.2° |
| $\{20\bar{2}3\}$ | 51.4° |
| $\{11\bar{2}2\}$ | 58.4° |
| $\{10\bar{1}1\}$ | 62.0° |
| $\{20\bar{2}1\}$ | 75.0° |
| $\{1\bar{1}00\}$ | 90° |
| $\{11\bar{2}0\}$ | 90° |

As expected, the $\{0001\}$ planes correspond to $\theta=0°$, the $\{1\bar{1}00\}$ and $\{11\bar{2}0\}$ planes correspond to $\theta=90°$, and the semipolar planes correspond to $0°<\theta<90°$.

The piezoelectric polarization of a crystal is determined by the strain state of the crystal. For heteroepitaxial growth of non-lattice matched crystal layers, the strain state of the individual layers is determined by the biaxial stress in the growth plane.

For a general crystal growth orientation along the z'-axis 200, the biaxially stress components $\sigma_{x'x'}$ and $\sigma_{y'y'}$ in the growth plane can be transformed into the conventional (x, y, z) coordinate system through the transformation matrix U. This allows the determination of the strain state and piezoelectric polarization in (x, y, z) coordinates. Thus, the piezoelectric polarization in (x, y, z) coordinates varies as function of the crystal angle (θ) 204 through the transformation matrix U. For a general crystal growth orientation, the piezoelectric polarization can be obtained by taking the scalar product between the polarization vector P in (x, y, z) coordinates and the unit vector ẑ' along the general crystal growth direction:

$$P_z' = P \cdot \hat{z}' = P_x \sin\theta + P_z \cos\theta \qquad (2)$$

where $P_x$ and $P_z$ represent the components of the piezoelectric polarization in (x, y, z) coordinates and are in general dependent on the crystal angle (θ) 204, as described above.

FIG. 3 illustrates the piezoelectric polarization 300 as a function of the angle between the growth direction and the c-axis for compressively strained $In_xGa_{1-x}N$ quantum wells with unstrained GaN barriers [Refs. 9, 18-20]. As expected, the polarization 300 is maximum for c-plane growth (θ=0°) and zero for a-plane or m-plane growth (θ=90°). In between these two limits, the polarization changes sign once and is equal to zero at some angle $\theta_o$ 302. The exact value of $\theta_o$ 302 is dependent on the values of several physical parameters such as the piezoelectric tensors and elastic constants, many of which are largely unknown at present [Refs. 21-25].

Much like piezoelectric polarization effects, effective hole masses for compressively strained $In_xGa_{1-x}N$ quantum wells can also be substantially reduced by altering the crystal growth orientation. Theoretical results [Ref. 9] show that the effective hole masses for compressively strained $In_xGa_{1-x}N$ quantum wells should decrease monotonically as the crystal angle is increased due to anisotropic strain-induced splitting of the heavy hole and light hole bands. Thus, growing compressively strained $In_xGa_{1-x}N$ quantum wells on semipolar orientations should significantly reduce effective hole masses, especially on orientations with large crystal angles.

SUMMARY OF THE INVENTION

The present invention describes a method for the growth and fabrication of semipolar (Ga,Al,In,B)N thin films, heterostructures, and devices. These structures may be grown either directly on suitable substrates or on semipolar (Ga,Al,In,B)N template layers pre-deposited on the substrate. Vapor phase epitaxy techniques, such as metalorganic chemical vapor deposition (MOCVD) and hydride vapor phase epitaxy (HVPE), are used to grow the semipolar (Ga,Al,In,B)N structures. However, the invention is equally applicable to semipolar (Ga,Al,In,B)N thin film, heterostructure, and device growth by molecular beam epitaxy (MBE) or any other suitable growth technique.

Growth of semipolar nitride thin films and heterostructures offers a means of reducing polarization effects and effective hole masses in würtzite nitride device structures. The term nitrides refers to any alloy composition of the (Ga,Al,In,B)N semiconductors having the formula $Ga_wAl_xIn_yB_zN$ where 0≤w≤1, 0≤x≤1, 0≤y≤1, 0≤z≤1, and w+x+y+z=1. Current commercially-available nitride devices are grown along the polar [0001] c-direction. The resulting polarization-induced electric fields and large effective hole masses are detrimental to the performance of state-of-the-art nitride optoelectronic devices.

Growth of these devices along a semipolar direction could significantly improve device performance by reducing built-in electric fields and effective hole masses. Reducing built-in electric fields decreases spatial charge separation in nitride quantum wells. Likewise, reducing effective hole masses decreases the carrier densities required to generate optical gain in nitride laser diodes.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Overview

Figure 1:
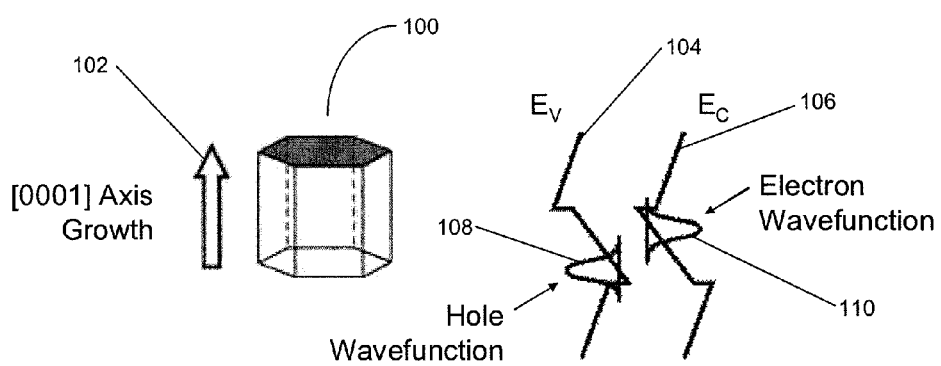
FIG. 1 is an illustration of band bending in compressively strained $In_xGa_{1-x}N$ quantum wells due to polarization-induced electric fields.
Figure 2:
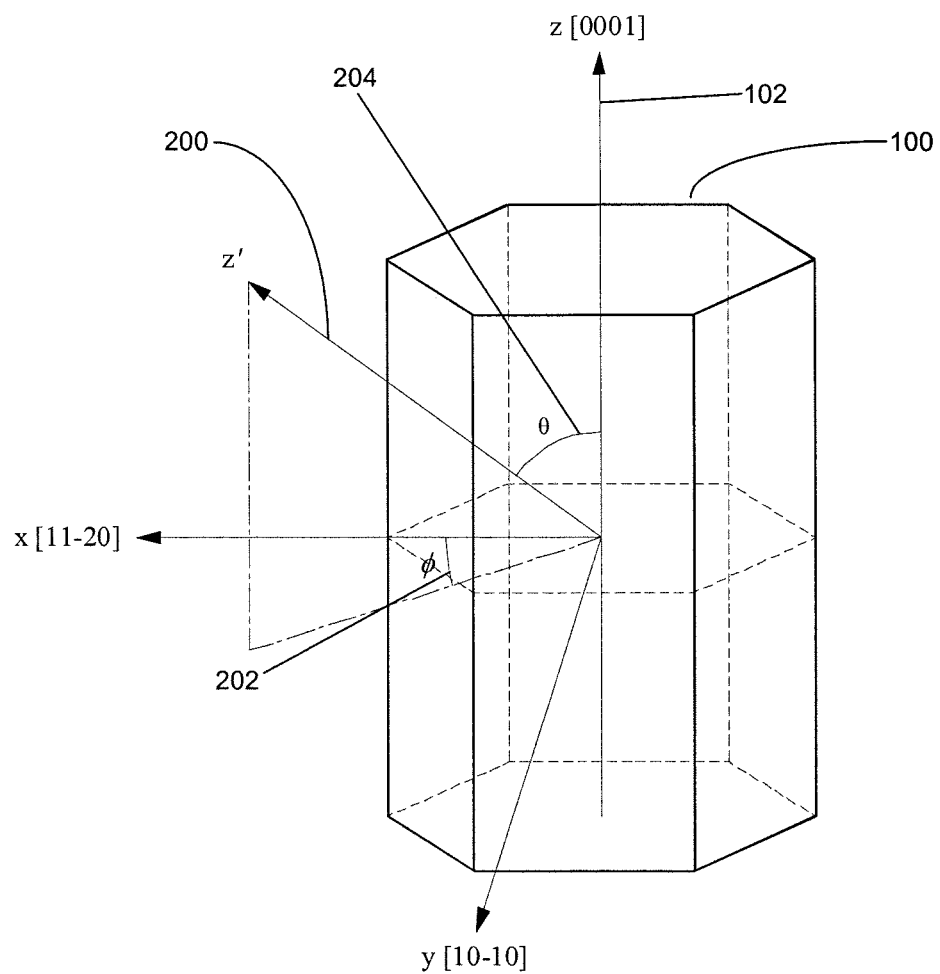
FIG. 2 illustrates the relationship between the conventional coordinate system (x, y, z) for c-plane crystal growth and the transformed coordinate system (x', y', z') for a general crystal growth orientation. The azimuthal and polar angles are indicated by φ and θ, respectively.
Figure 3:
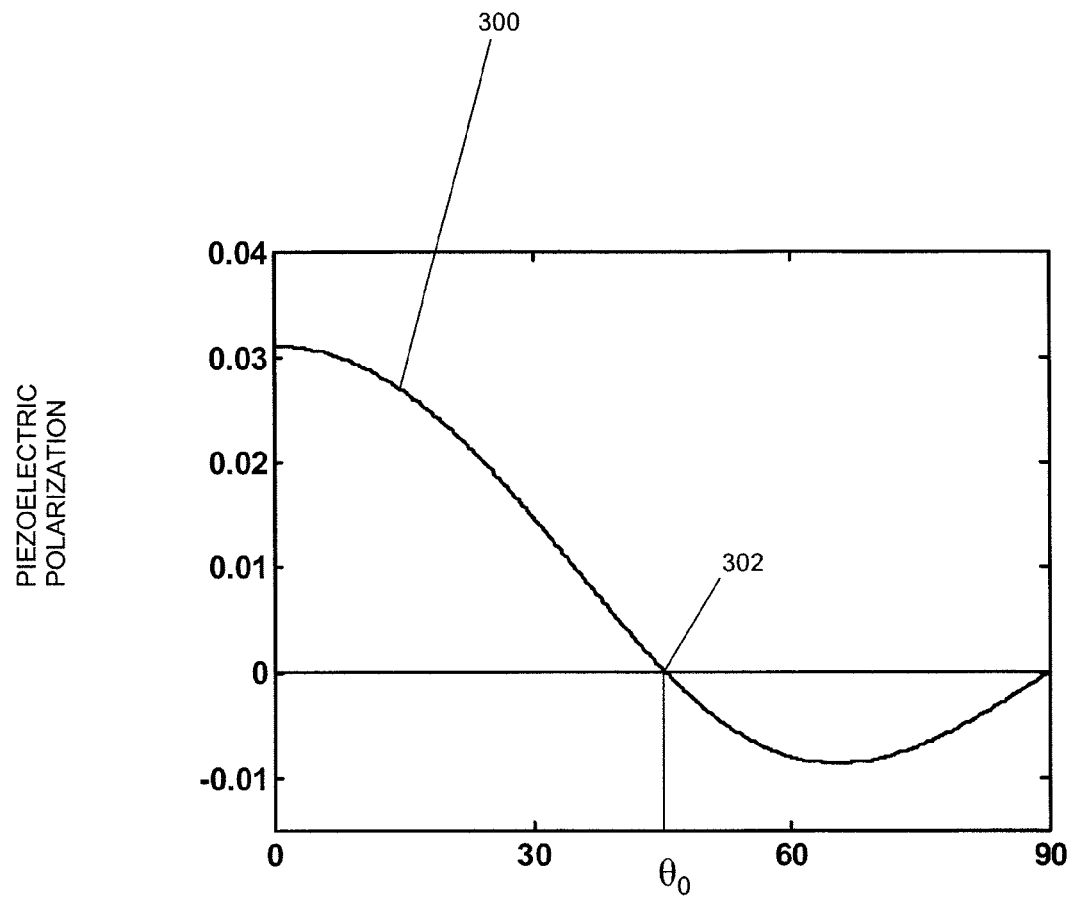
FIG. 3 is a graph that illustrates piezoelectric polarization as a function of the angle between the growth direction and the c-axis for compressively strained $In_xGa_{1-x}N$ quantum wells with unstrained GaN barriers.
Figure 4:
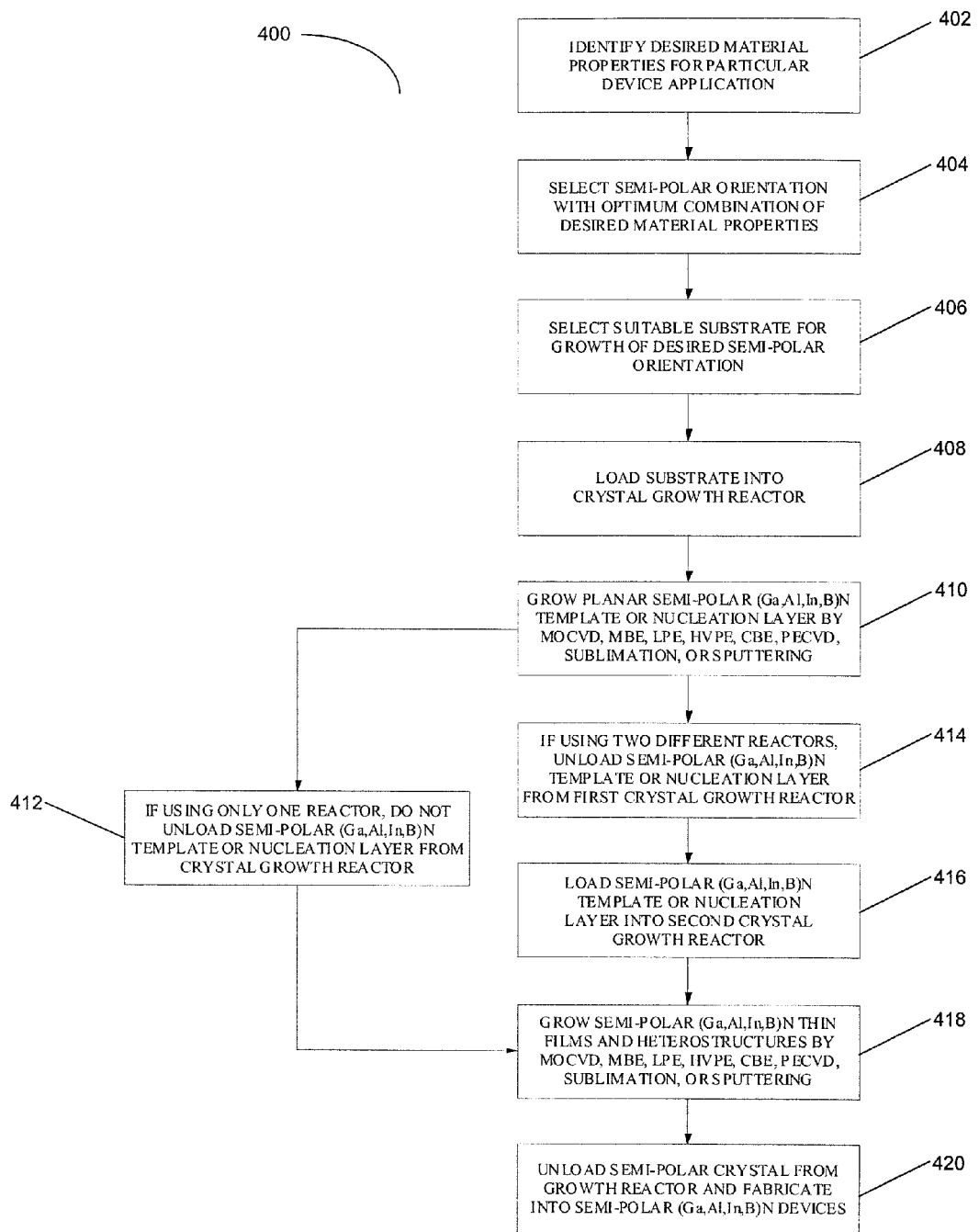
FIG. 4 is a flowchart outlining the salient steps for the growth and fabrication of semipolar (Ga,Al,In,B)N thin films, heterostructures, and devices. This flowchart illustrates how a number of different growth methods and sequences can be used within the scope of the present invention.

The present invention comprises a method for the growth and fabrication of semipolar (Ga,Al,In,B)N thin films, heterostructures, and devices. The flowchart 400 in FIG. 4 summarizes the salient steps for the growth of semipolar (Ga,Al,In,B)N thin films and heterostructures.

Steps 402 and 404 outline a top-down device design procedure used for selecting a semipolar growth orientation. First, the desired material properties (piezoelectric polarization, effective hole mass, etc.) for a particular device application need to be identified as shown in step 402. Based on these desired properties, the semipolar orientation with the optimum combination of material properties should be selected for growth of the semipolar (Ga,Al,In,B)N thin films and heterostructures in step 404. This top-down device design procedure is of course an idealization; it presumes that the crystal quality for all semipolar orientations is equal. Adjustments in the device design procedure should be made to conform with actual practice.

After choosing the optimum semipolar growth orientation, the appropriate substrate needs to be selected in step 406. This substrate would ideally be a free-standing semipolar nitride wafer having a composition lattice matched to the structure to be grown. More often, though, the substrate will be a foreign material, such as $MgAl_2O_4$ (spinel) or $Al_2O_3$ (sapphire). The foreign substrate may optionally be coated with a nitride template layer by any suitable growth technique, including, but not limited to, HVPE, MOCVD, MBE, liquid phase epitaxy (LPE), chemical beam epitaxy (CBE), plasma-enhanced chemical vapor deposition (PECVD), sublimation, or sputtering. The composition of the template layer need not exactly match that of the structure to be deposited. The thickness of the template layer may range from a few nanometers (this would be termed a nucleation or buffer layer) to tens or hundreds of micrometers. While not required, the use of templates will generally improve uniformity and yield of semipolar nitride devices. For illustrative purposes, without limiting the scope of the invention, the remainder of this disclosure will describe the use of HVPE-grown semipolar GaN templates for the practice of the invention.

After the substrate or template has been selected, it is loaded into a reactor for growth of the desired semipolar (Ga,Al,In,B)N thin films and heterostructures in step 408. Suitable growth methods used in steps 410-418 for the practice of this invention include, but are not limited to, HVPE, MOCVD, MBE, LPE, CBE, PECVD, sublimation, sputtering, or any other vapor deposition method. For illustrative purposes, the remainder of this disclosure will describe the growth of semipolar thin films and heterostructures by MOCVD. However, this focus should not be construed as a limitation on the applicability of the invention to other growth techniques. Finally, after the semipolar (Ga,Al,In,B)N structure has been grown, the crystal is removed from the thin film growth reactor and processed into semipolar devices in step 420.

Technical Description

The present invention, which describes the growth and fabrication of semipolar (Ga,Al,In,B)N thin films, heterostructures, and devices, involves the following elements:

1. Identification of the desired material properties for a particular device application.
2. Selection of the semipolar orientation with the optimum combination of material properties.
3. Selection of a suitable substrate or template for the growth of the desired semipolar orientation.
4. Growth of the semipolar thin films, heterostructures, and devices by a suitable growth technique.

As discussed above, the practice of the invention is enhanced by the use of thick planar semipolar GaN templates grown by HVPE. To date, we have successfully grown several different planar semipolar GaN template orientations by HVPE. The details of the template growth have been disclosed separately; for reference please see U.S. Provisional Patent Application Ser. No. 60/660,283, entitled "TECHNIQUE FOR THE GROWTH OF PLANAR SEMI-POLAR GALLIUM NITRIDE," filed on Mar. 10, 2005, by Troy J. Baker, Benjamin A. Haskell, Paul T. Fini, Steven P. DenBaars, James S. Speck, and Shuji Nakamura, which application is incorporated by reference herein. In summary, we have experimentally demonstrated four examples of planar semipolar nitride templates:

1. {10$\bar{1}$1} GaN on {100} spinel miscut in specific directions
2. {10$\bar{1}$3} GaN on {110} spinel
3. {11$\bar{2}$2} GaN on {1-100} sapphire
4. {10$\bar{1}$3} GaN on {1-100} sapphire The crystal quality of these semipolar planes shows little dependence on growth temperature and pressure. The {10$\bar{1}$1} and {10$\bar{1}$3} orientations have been grown at pressures between 10 Torr and 1000 Torr and at temperatures between 900° C. and 1200° C. with little effect on overall crystal quality. This wide range of pressure and temperature shows that these semipolar planes are very stable when grown on the specified substrates. The epitaxial relationships between the particular semipolar planes and specified substrates hold true regardless of the type of growth system used to fabricate the films. However, the optimal reactor conditions for growing these planes will vary according to individual reactor designs and growth methods.

Using these planar HVPE-grown semipolar GaN layers as templates for the growth of semipolar (Ga,Al,In,B)N thin films and heterostructures by MOCVD, we have grown and fabricated semipolar (Ga,Al,In,B)N LEDs on several different semipolar orientations. In particular, we have successfully demonstrated semipolar LEDs on {10$\bar{1}$1} GaN templates on {100} spinel, on {10$\bar{1}$3} GaN templates on {1-100} sapphire, and on {10$\bar{1}$3} GaN templates on {110} spinel.

Figure 5:
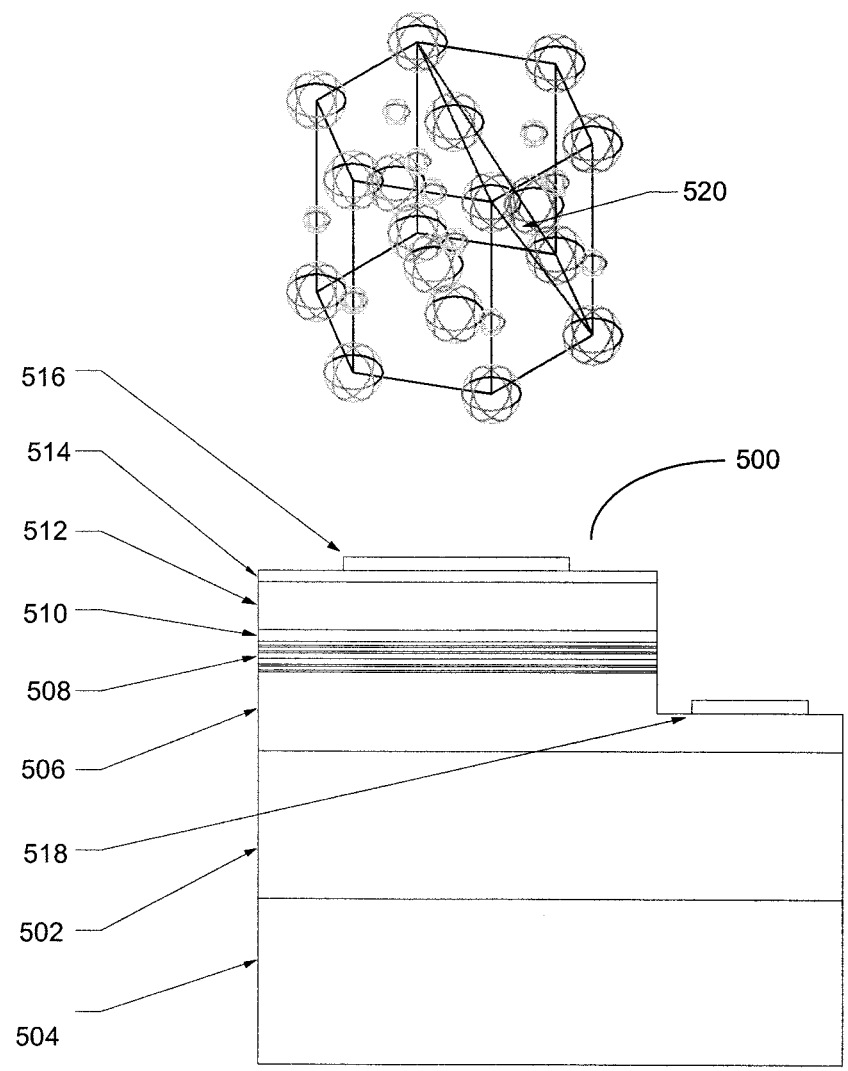
FIG. 5 is a schematic cross-section of a blue (~439 nm peak) LED grown on a {10$\bar{1}$1} semipolar GaN template.

As shown in FIG. 5, the first exemplary semipolar LED structure was re-grown by MOCVD on a 10 μm-thick HYPE-grown {10$\bar{1}$1} GaN template 502 on a {100} spinel substrate 504. The re-growth, carried out in a vertical MOCVD reactor, began with a 2.0 μm Si-doped n-type GaN base layer 506. The active region 508 consisted of a 5 period multiple quantum well (MQW) stack with 16 nm Si-doped GaN barriers and 4 nm InGaN quantum wells. A 16 nm undoped GaN barrier 510 was deposited at low temperature to cap the InGaN MQW structure in order to prevent desorption of InGaN from the active region later in the growth. A 300 nm Mg-doped p-type GaN layer 512 was then deposited. The structure was capped with a 40 nm heavily Mg-doped p$^+$-type GaN contact layer 514.

Figure 6:
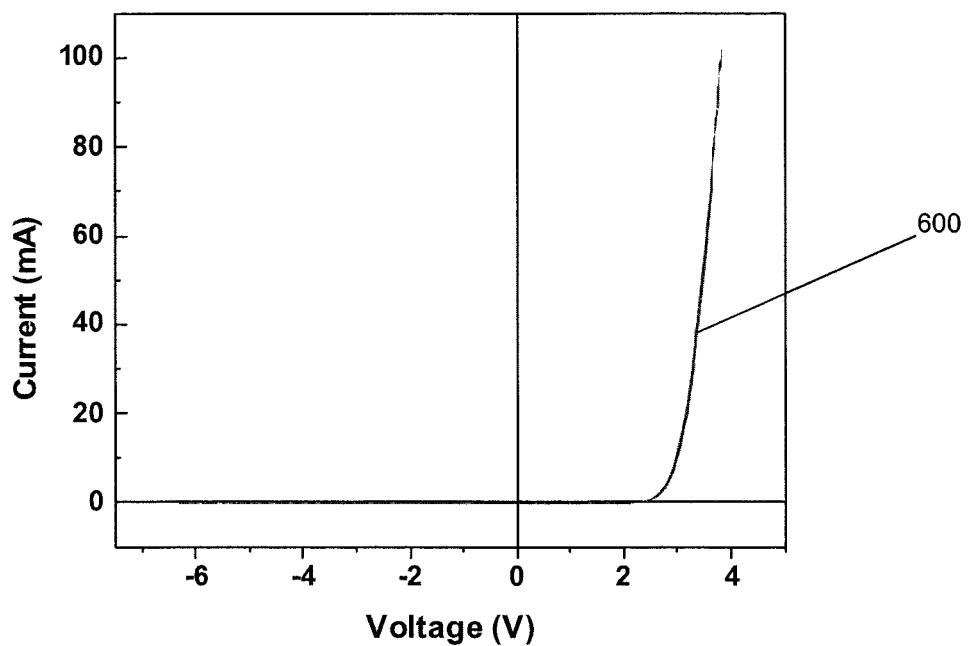
FIG. 6 is a graph of the current-voltage (I-V) characteristic of a blue (~439 nm peak) LED grown on a {10$\bar{1}$1} semipolar GaN template.
Figure 7:
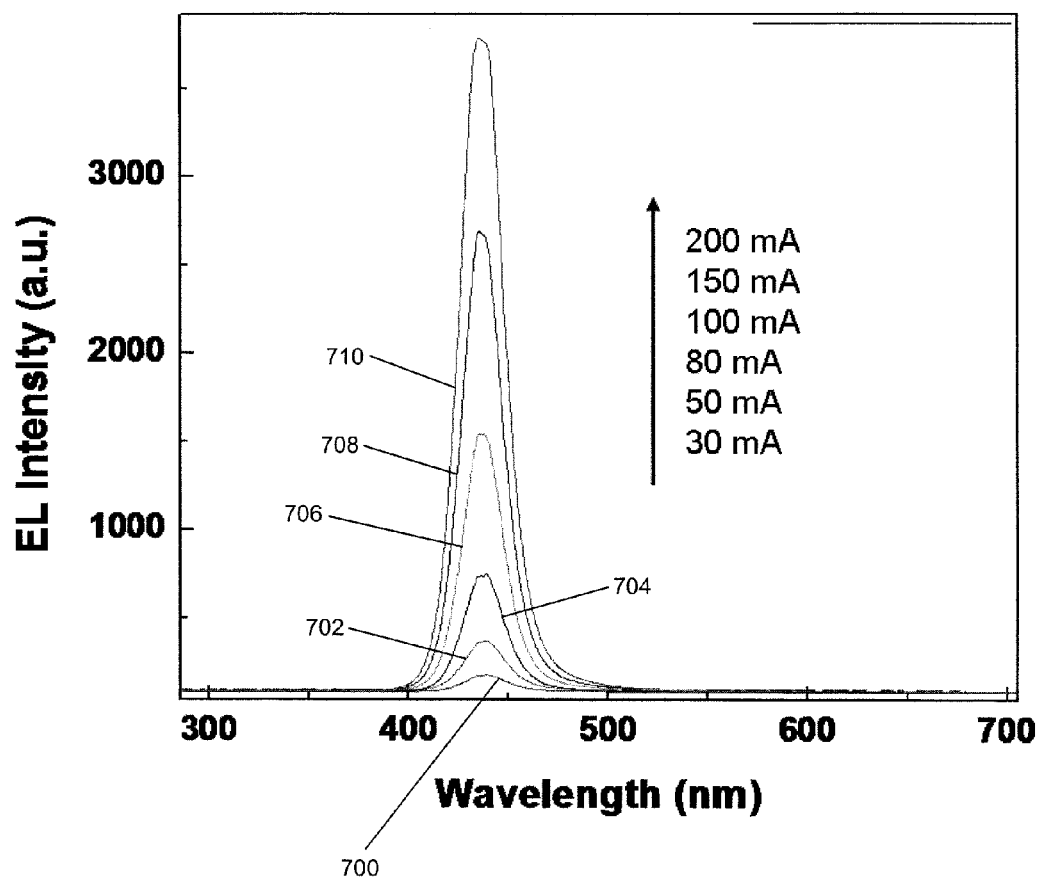
FIG. 7 is a graph of the electroluminescence (EL) spectra at different drive currents for a blue (~439 nm peak) LED grown on a {10$\bar{1}$1} semipolar GaN template.
Figure 8:
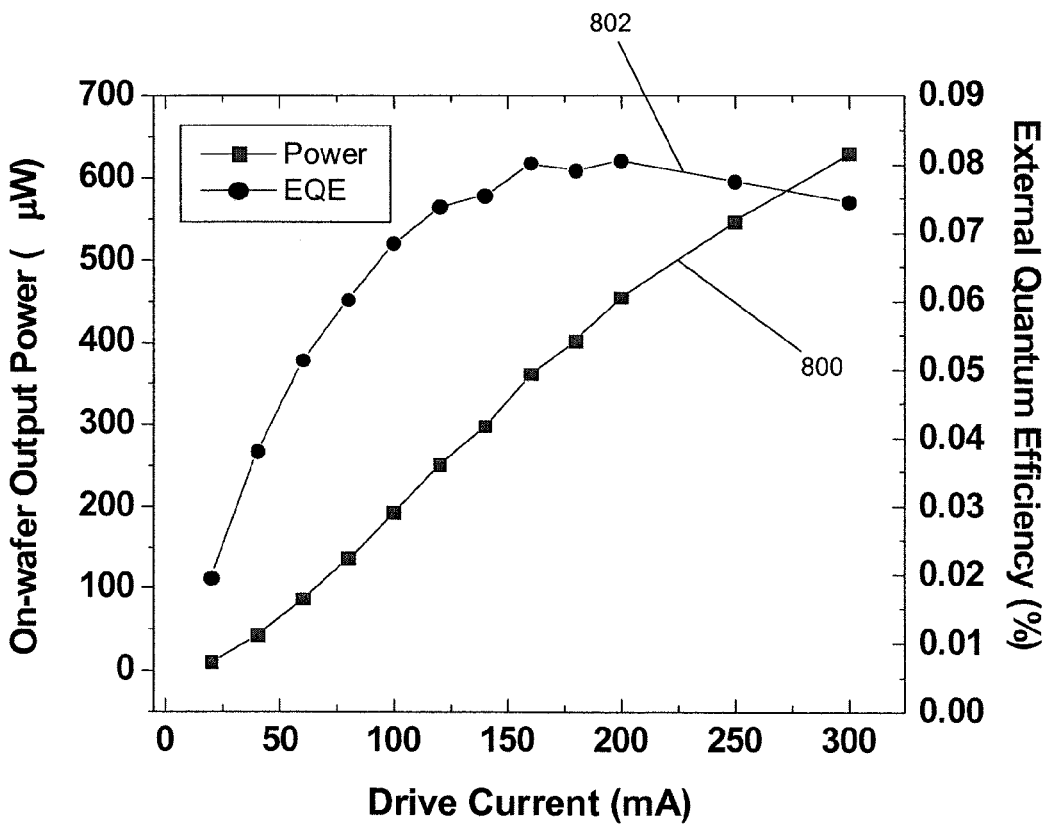
FIG. 8 is a graph of the on-wafer output power and external quantum efficiency (EQE) as function of drive current for a blue (~439 nm peak) LED grown on a {10$\bar{1}$1} semipolar GaN template.

Following the growth, 300×300 μm$^2$ diode mesas were defined by chlorine-based reactive ion etching (RIE). Pd/Au (20/200 nm) and Al/Au (20/200 nm) were used as p-type GaN and n-type GaN contacts 516 and 518, respectively. A schematic cross-section of the semipolar LED structure, and the {10$\bar{1}$1} plane 520, are shown in FIG. 5. The electrical and luminescence characteristics of the diode were measured by on-wafer probing of the devices. The current-voltage (I-V) characteristic 600 of a typical LED is shown in FIG. 6. Relative optical power measurements under direct current (dc) conditions were obtained from the backside emission through the spinel substrate onto a calibrated broad area Si photodiode. The electroluminescence (EL) spectra and the optical power emission of the LEDs were measured as a function of drive current as shown in FIGS. 7 and 8, respectively. All measurements were carried out at room temperature.

As shown in FIG. 6, the I-V characteristic 600 of the diode exhibited a low turn-on voltage of 3.1 V with a series resistance of 6.9Ω. EL spectra were also measured at drive currents ranging from 30 to 200 mA. As shown in FIG. 7, the devices show emission spectra 700-710 in the blue spectral range at 439 nm for all drive currents with no observable peak shift. The emission spectra 700-710 correspond to the drive currents 30 mA-200 mA respectively. The absence of a blue-shift in the emission peak with increasing drive current is in contrast to the commonly observed phenomenon of a blue shift in c-plane LEDs operating in this wavelength range and similar drive current range.

Finally, the on-wafer output power and external quantum efficiency were measured as a function of the dc drive current. As shown in FIG. 8, the output power 800 increased approximately linearly as the drive current was increased from 10 mA to 300 mA. The output power at 20 mA forward current was 11 μW, corresponding to an external quantum efficiency (EQE) 802 of 0.02%. DC power as high as 630 μW was measured for a drive current of 300 mA. The EQE increased as the drive current was increased, attaining a maximum of 0.081% at 200 mA, and then decreased slightly as the forward current was increased beyond 200 mA. The absence of a significant decrease in the EQE with increasing drive current is in contrast to the commonly observed phenomenon of a significant decrease in the EQE in c-plane LEDs operating in this wavelength range and similar drive current range.

Although not presented here, photoluminescence (PL) spectra were also compared for the blue (~439 nm peak) semipolar LEDs grown on {10$\bar{1}$1} GaN templates on {100} spinel with co-loaded c-plane LEDs grown on {0001} GaN templates on {0001} sapphire. Co-loaded implies that the c-plane template was loaded into the MOCVD reactor at the same time as the semipolar template and that the two templates were resting on the same susceptor during the growth. The PL spectra for the semipolar LEDs were very similar to the PL spectra for the co-loaded c-plane LEDs, suggesting that the indium incorporation efficiency of semipolar In$_x$Ga$_{1-x}$N thin films and c-plane In$_x$Ga$_{1-x}$N thin films is comparable. This agrees with previous studies of lateral epitaxial over-growth along semipolar facets which indicate that there is strong impurity incorporation along semipolar planes [Refs. 26, 27].

Figure 9:
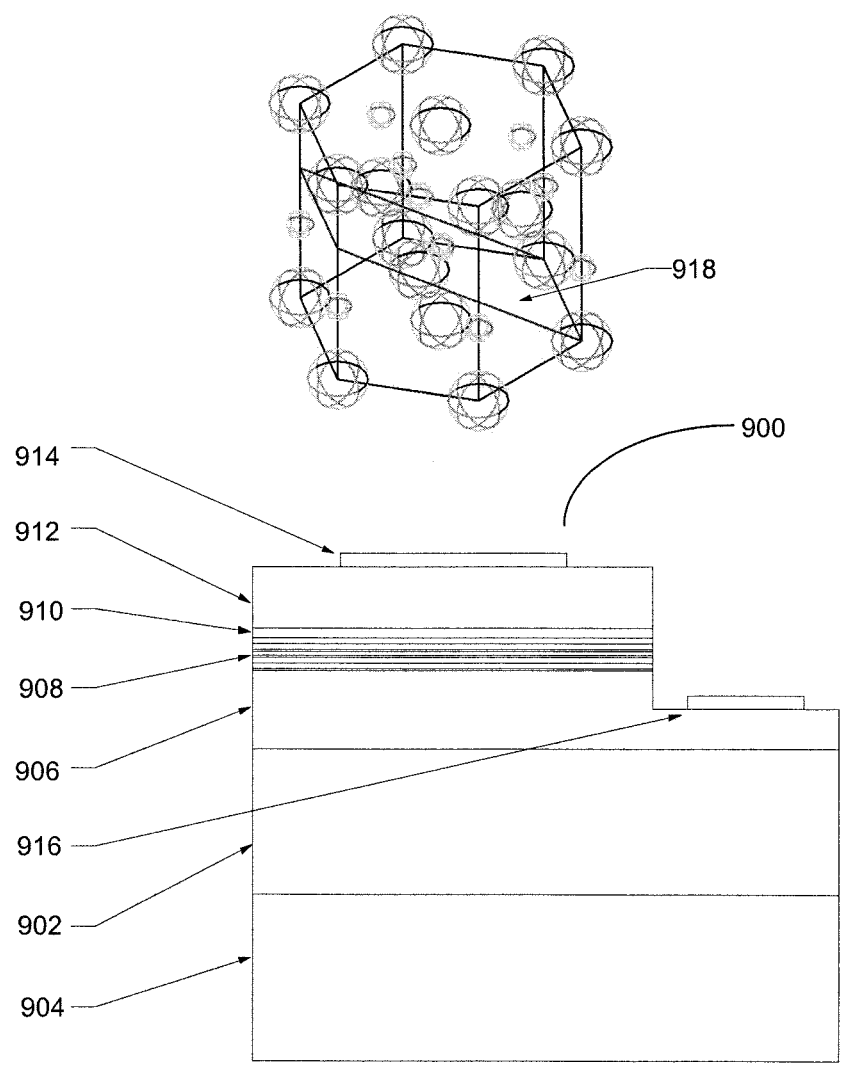
FIG. 9 is a schematic cross-section of a green (~525 nm peak) LED grown on a {10$\bar{1}$3} semipolar GaN template.

In addition to the blue (~439 nm peak) LEDs grown on {10$\bar{1}$1} GaN templates on {100} spinel, FIG. 9 illustrates a green (~525 nm peak) LED 900 grown on a {10$\bar{1}$3} GaN template 902 on {1$\bar{1}$00} sapphire substrate 904. This semipolar LED structure 900 was re-grown by MOCVD on a 10 μm-thick HYPE-grown {10$\bar{1}$3} GaN template 902 on {1$\bar{1}$00} sapphire 904. The re-growth, carried out in a conventional horizontal-flow MOCVD reactor, began with a 500 nm Si-doped n-type GaN base layer 906. The active region 908 consisted of a 5 period multiple quantum well (MQW) stack with 8 nm undoped GaN barriers and 4 nm InGaN quantum wells. A 20 nm Mg-doped p-type AlGaN barrier 910 was deposited at low temperature to cap the InGaN MQW structure in order to prevent desorption of InGaN from the active region 908 later in the growth. The structure was capped with 200 nm of Mg-doped p-type GaN 912.

Figure 10:
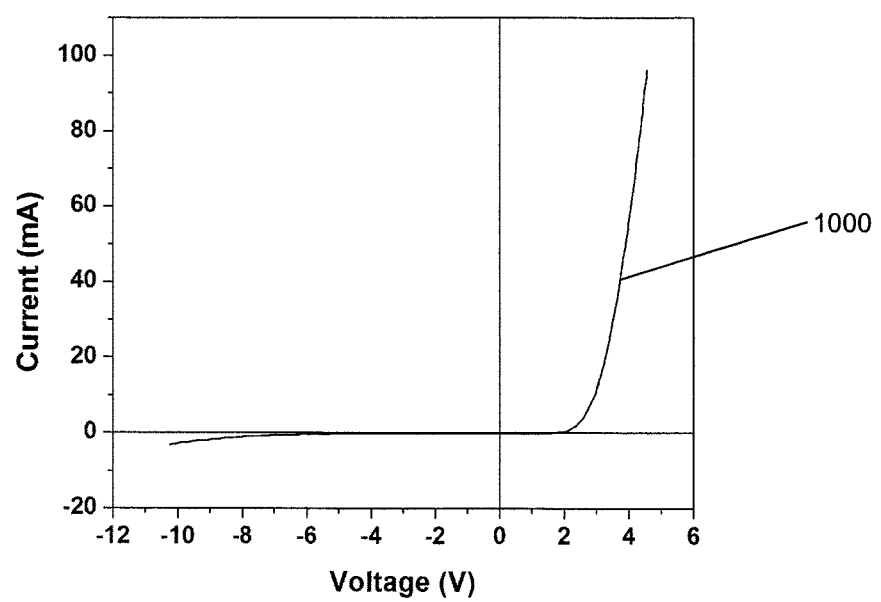
FIG. 10 is a graph of the current-voltage (I-V) characteristic of a green (~525 nm peak) LED grown on a {10$\bar{1}$3} semipolar GaN template.
Figure 11:
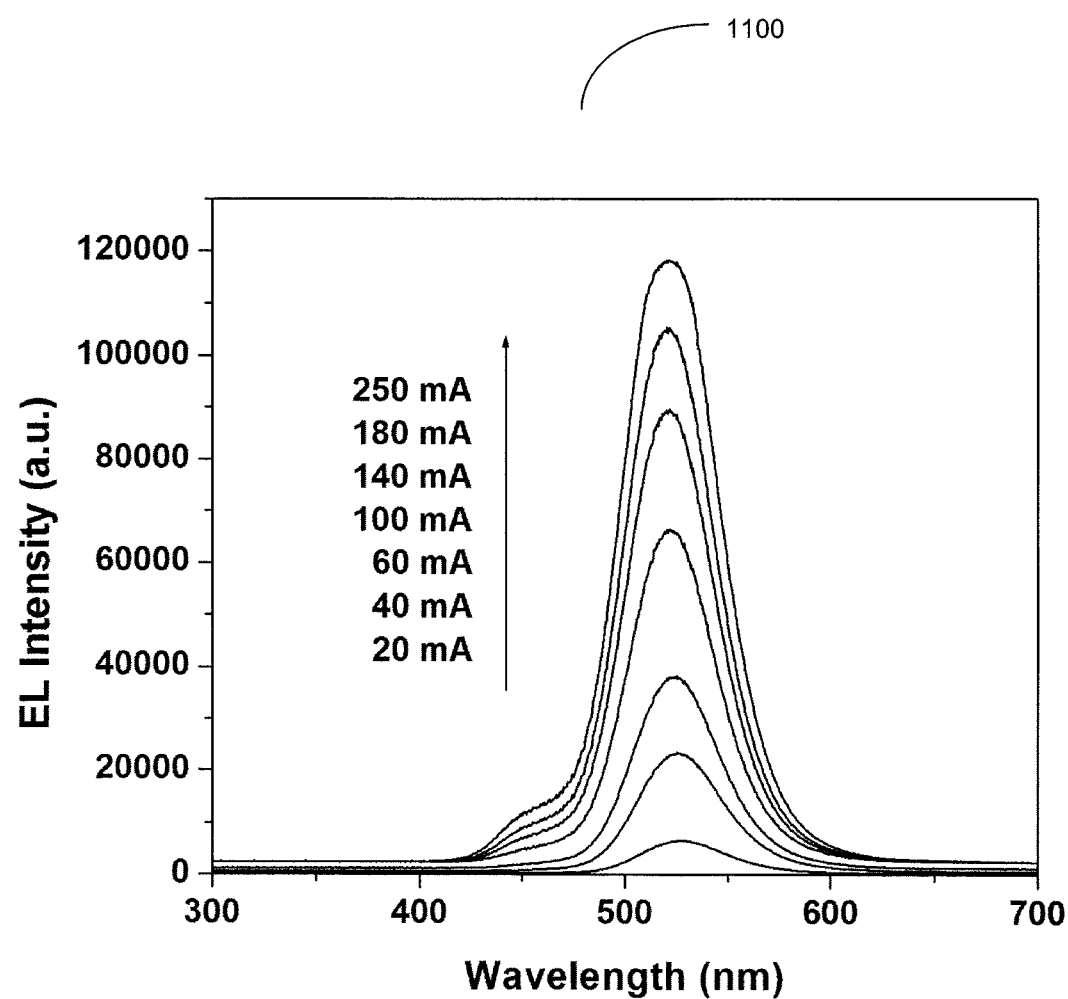
FIG. 11 is a graph of the electroluminescence (EL) spectra at different drive currents for a green (~525 nm peak) LED grown on a {10$\bar{1}$3} semipolar GaN template.
Figure 12:
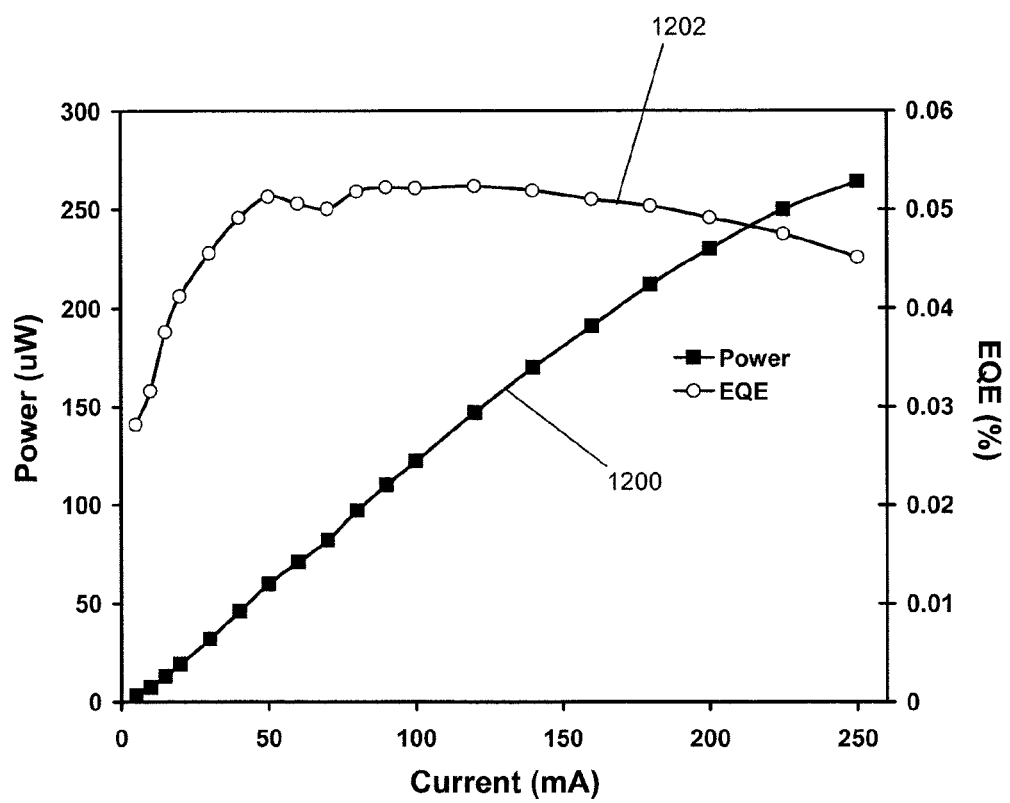
FIG. 12 is a graph of the on-wafer output power and external quantum efficiency (EQE) as a function of drive current for a green (~525 nm peak) LED grown on a {10$\bar{1}$3} semipolar GaN template.

Following the growth, 300×300 μm$^2$ diode mesas were defined by chlorine-based RIE. Pd/Au (5/6 nm) and Ti/Al/Ni/Au (20/100/20/300 nm) were used as p-type GaN and n-type GaN contacts, 914 and 916, respectively. A schematic cross-section of the semipolar LED structure, and the {10$\bar{1}$3} plane 918, are shown in FIG. 9. The electrical and luminescence characteristics of the diode were measured by on-wafer probing of the devices. The I-V characteristic 1000 of a typical LED is shown in FIG. 10. Relative optical power measurements under direct current (dc) conditions were obtained from backside emission through the sapphire substrate onto a calibrated broad area Si photodiode. The EL spectra and the optical power emission of the LEDs were measured as a function of driving current as shown in FIGS. 11 and 12, respectively. All measurements were carried out at room temperature.

As shown in FIG. 10, the I-V characteristic 1000 of the diode exhibited a low turn-on voltage of 3.2 V with a series resistance of 14.3 Ω. EL spectra were also measured at drive currents ranging from 30 to 200 mA. As shown in FIG. 11, the EL spectra 1100 show that the device 900 emitted in the green spectral range, shifting slightly from 528 nm at 20 mA to 522 nm at 200 mA. The absence of a significant blue-shift in the emission peak with increasing drive currents is in contrast to the commonly observed phenomenon of a considerable blue-shift in c-plane LEDs working at this wavelength range and similar drive current range.

The on-wafer output power and external quantum efficiency were also measured as a function of the dc drive current. As shown in FIG. 12, the output power 1200 increased approximately linearly as the drive current was increased from 10 mA to 250 mA. The output power 1200 at 20 mA forward current was 19.3 μW, corresponding to an external quantum efficiency (EQE) 1202 of 0.041%. DC power as high as 264 μW was measured for a drive current of 250 mA. The EQE 1202 increased as the drive current was increased, attaining a maximum of 0.052% at 120 mA, and then decreased slightly as the forward current was increased beyond 120 mA. The absence of significant decrease in the EQE 1202 with increasing drive currents is in contrast to the commonly observed phenomenon of a significant decrease in the EQE 1202 in c-plane LEDs working at this wavelength range and similar drive current range.

Figure 13:
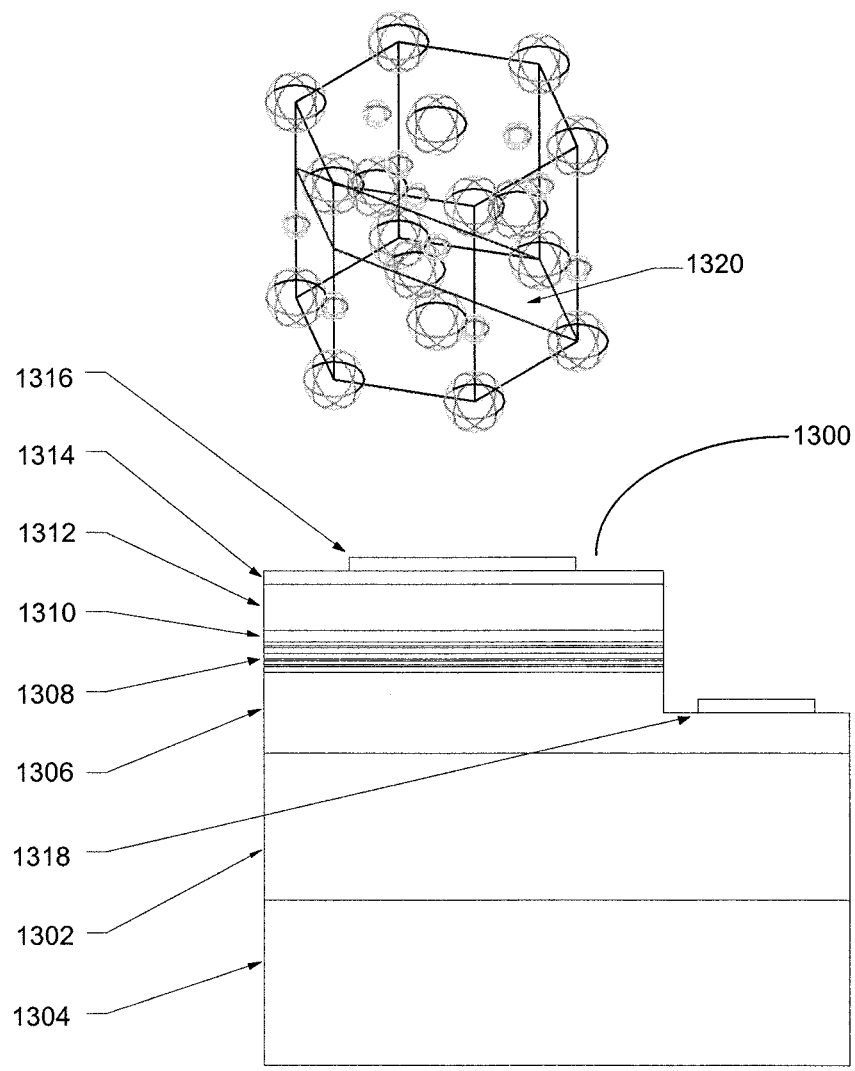
FIG. 13 is a schematic cross-section of a blue (~440 nm peak) LED grown on a {10$\bar{1}$3} semipolar GaN template.

Finally, FIG. 13 illustrates a blue (~440 nm peak) semipolar LED 1300 on a {10$\bar{1}$3} GaN template 1302 on {110} spinel substrate 1304. The re-growth, carried out in a vertical MOCVD reactor, began with a 2.0 µm Si-doped n-type GaN base layer 1306. The active region 1308 consisted of a 5 period multiple quantum well (MQW) stack with 16 nm Si-doped GaN barriers and 4 nm InGaN quantum wells. A 16 nm undoped GaN barrier 1310 was deposited at low temperature to cap the InGaN MQW structure in order to prevent desorption of InGaN from the active region 1308 later in the growth. A 300 nm Mg-doped p-type GaN layer 1312 was then deposited. The structure was capped with a 40 nm heavily doped p$^+$-GaN contact layer 1314.

Figure 14:
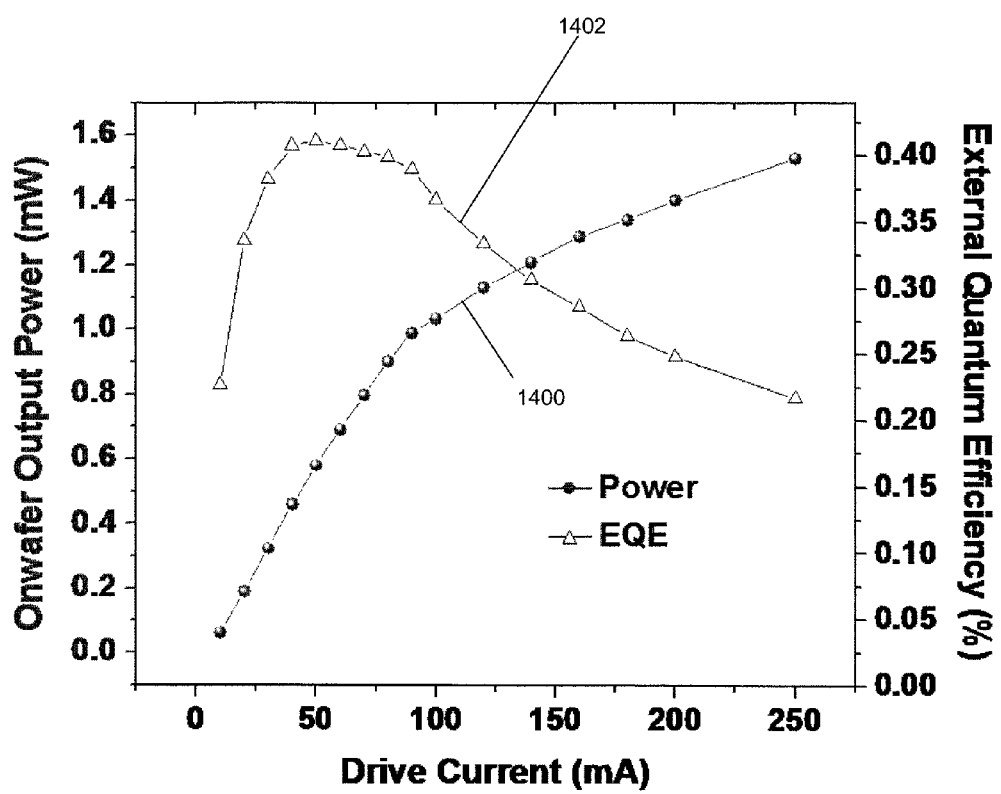
FIG. 14 is a graph of the on-wafer output power and external quantum efficiency (EQE) as a function of drive current for a blue (~440 nm peak) LED grown on a {10$\bar{1}$3} semipolar GaN template.

Following the growth, 300×300 µm$^2$ diode mesas were defined by chlorine-based RIE. Pd/Au (20/200 nm) and Al/Au (20/200 nm) were used as p-type GaN and n-type GaN contacts 1316 and 1318, respectively. A schematic cross-section and the {10$\bar{1}$3} plane 1320 of the semipolar LED structure 1300 is shown in FIG. 13. The electrical and luminescence characteristics of the diode were measured by on-wafer probing of the devices. Relative optical power measurements under direct current (dc) conditions were obtained from the backside emission through the spinel substrate onto a calibrated broad area Si photodiode. Although not presented here, the I-V characteristic and EL spectra as a function of drive current were similar to the blue (~439 nm peak) semipolar LEDs grown on a {10$\bar{1}$1} GaN template on {100} spinel. The optical power emission of the LEDs was measured as a function of drive current as shown in FIG. 14. All measurements were carried out at room temperature.

As shown in FIG. 14, the output power 1400 increased approximately linearly as the drive current was increased from 10 mA to 90 mA, and then increased sublinearly up to 250 mA. The output power 1400 at 20 mA forward current was 190 µW, corresponding to an external quantum efficiency (EQE) 1402 of 0.34%. DC power as high as 1.53 mW was measured for a drive current of 250 mA. The EQE 1402 increased as the drive current was increased, attaining a maximum of 0.41% at 50 mA, and then decreased significantly as the forward current was increased beyond 50 mA. This significant decrease in the EQE 1402 with increasing drive current is in contrast to the lack of a decrease in the EQE 1402 with increasing drive current for the blue (~439 nm peak) semipolar LEDs on a {10$\bar{1}$1} GaN template on {100} spinel and the green (~525 nm) semipolar LEDs on a {10$\bar{1}$3} GaN template on {1$\bar{1}$00} sapphire. Nevertheless, compared to the other two semipolar LEDs, this semipolar LED demonstrated significantly higher values of peak output power 1400 and peak EQE 1402, clearly demonstrating the potential for competition with c-plane nitride technology.

The device structures described above constitute the first report of functioning semipolar InGaN-based LEDs. In summary, the present invention demonstrates semipolar LEDs operating in two different spectral ranges, on two different semipolar orientations, and on three different substrates. These include blue (~439 nm peak) semipolar LEDs on a {10$\bar{1}$1} GaN template on {100} spinel, green (~525 nm) semipolar LEDs on a {10$\bar{1}$3} GaN template on {1$\bar{1}$00} sapphire, and blue (~440 nm peak) semipolar LEDs on a {10$\bar{1}$3} GaN template on {100} spinel. The presentation of these three examples is for illustrative purposes only and should not be interpreted as a limitation on the applicability of the invention to other growth orientations or device structures.

Possible Modifications and Variations

The devices described in the Technical Description comprise light emitting diodes. However, the scope of this invention includes the growth and fabrication of any semipolar (Ga,Al,In,B)N device. Thus, the device structures should not be considered limited to LEDs. Other potential semipolar devices that could be grown and fabricated by the methods of this invention include edge-emitting laser diodes (EELs), vertical cavity surface emitting laser diodes (VCSELs), resonant cavity LEDs (RCLEDs), microcavity LEDs (MCLEDs), high electron mobility transistors (HEMTs), heterojunction bipolar transistors (HBTs), heterojunction field effect transistors (HFETs); and visible, UV, and near-UV photodetectors. These examples and other possibilities still incur all of the benefits of semipolar (Ga,Al,In,B)N devices. This list of possible devices is for illustrative purposes only and should not be construed as a limit on the applications of the invention. Rather, this invention claims any nitride-based device that is grown along semipolar directions or on semipolar planes.

In particular, this invention should offer significant benefits in the design and fabrication of (Ga,Al,In,B)N laser diodes. Such benefits should be especially substantial in long-wavelength laser diodes that have particularly large piezoelectric fields, such as the conceptual device 1500 shown in FIG. 15. In addition, theoretical calculations indicate that the effective hole masses for compressively strained In$_x$Ga$_{1-x}$N quantum wells should decrease monotonically as the crystal angle is increased due to anisotropic strain-induced splitting of the heavy hole and light hole bands [Ref. 9]. Self-consistent calculations of many-body optical gain for compressively strained In$_x$Ga$_{1-x}$N quantum wells suggest that the peak gain is most sensitive on effective hole mass and that it increases monotonically with increasing crystal angle [Refs. 17, 18]. Thus, the high carrier densities required to generate optical gain in typical nitride-based laser diodes can be reduced by growing the laser structures on semipolar orientations, especially those with crystal angles closest to θ=90°.

Figure 15:
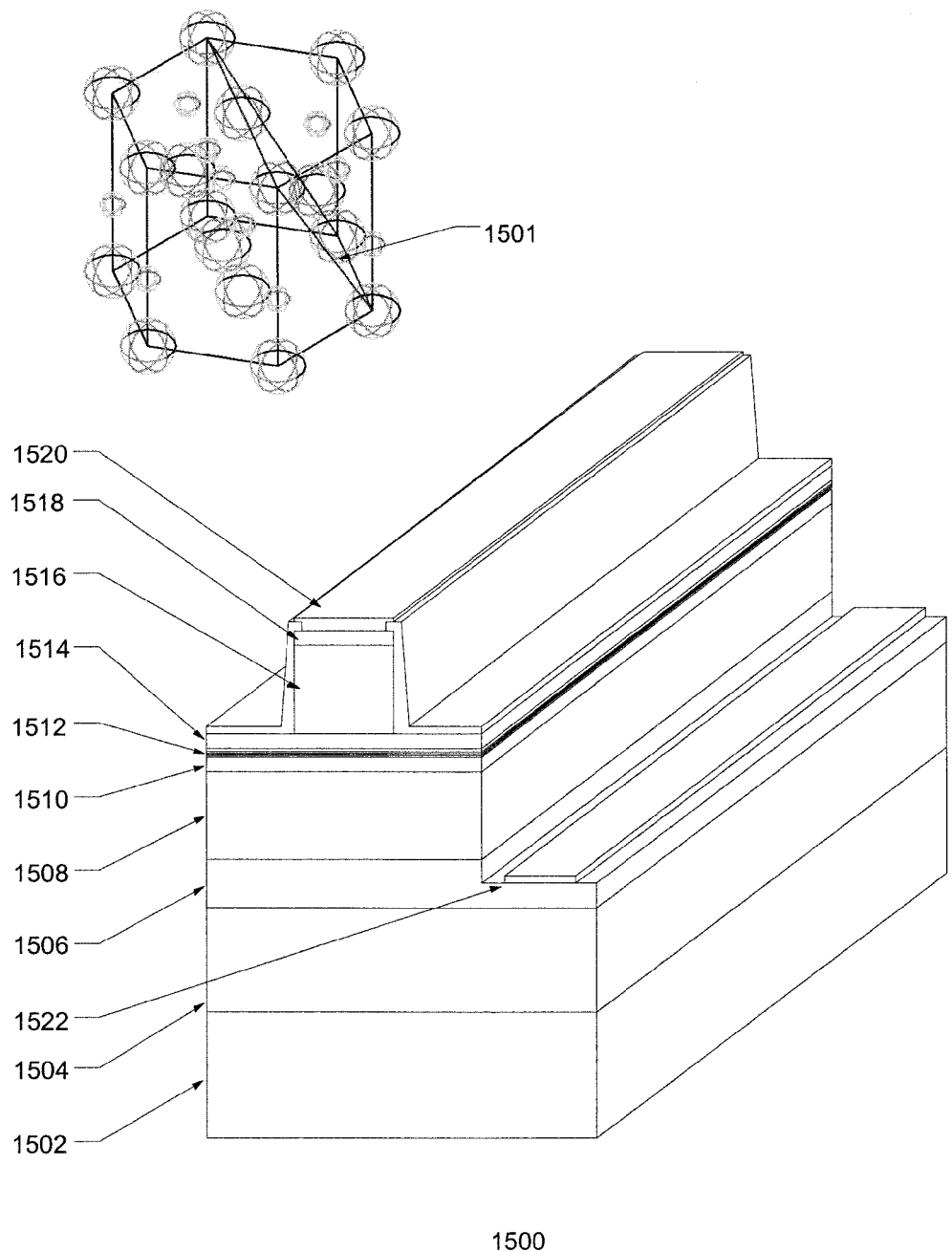
FIG. 15 is a schematic of a semipolar nitride laser diode designed for emission in the green region of the spectrum (~525 nm peak). Of the demonstrated semipolar orientations, the {10$\bar{1}$1} semipolar orientation should provide the optimum combination of net polarization and effective hole mass in the active region for a semipolar nitride laser.

This is reflected in the design of the laser diode 1500 shown in FIG. 15; of the semipolar orientations that we have demonstrated experimentally, the {10$\bar{1}$1} orientation 1501 has the largest crystal angle (θ=62.0°) and should offer the most substantial improvements in optical gain.

{100} Spinel substrate 1502 is used to grow a {10$\bar{1}$1} semipolar GaN template 1504, and a regrowth of n-GaN layer 1506 is then performed as described above. A n-AlGaN/GaN Cladding Layer 1508 is then grown, and topped by a n-GaN waveguiding layer 1510. A MQW active layer 1512 is then grown, with a p-GaN waveguiding layer 1514 grown on the MQW active layer 1512. Another cladding layer 1516 is then grown, and a p-GaN contact layer is then grown. Ni/Au contact 1520 and Ti/Al/Ni/Au contacts 1522 are then deposited.

The performance of electronic devices should also benefit from this invention. Lower effective hole masses in strained semipolar (Ga,Al,In,B)N layers should result in higher hole mobilities, which should increase the electrical conductivity of semipolar p-type (Ga,Al,In,B)N layers. The higher mobility in strained semipolar p-type (Ga,Al,In,B)N layers should result in improved performance of bipolar electronic devices such as HBTs. The higher p-type conductivity in semipolar nitrides should also result in lower series resistances in p-n junction diodes and LEDs. Furthermore, by altering the crystal growth orientation, the magnitude and direction of the piezoelectric polarization can be tailored to a specific device application. Thus, devices that utilize piezoelectric polarization to generate desirable device characteristics (such as HEMTs) should also benefit from the versatility of this invention.

Variations in semipolar (Ga,Al,In,B)N quantum well and heterostructure design are possible without departing from the scope of the present invention. Moreover, the specific thickness and composition of the layers, in addition to the number of quantum wells grown, are variables inherent to particular device designs and may be used in alternative embodiments of the present invention. For instance, the devices in the preferred embodiment of the invention utilize InGaN-based quantum wells for light emission in the blue and green regions of the spectrum. However, the scope of the invention also includes devices with AlGaN-, AlInN-, and AlInGaN-based quantum wells, which could be designed for light emission in other regions of the spectrum. Furthermore, potential devices such as semipolar HEMTs, HBTs, and HFETs may not even include quantum wells in their respective device structures.

Variations in MOCVD growth conditions such as growth temperature, growth pressure, V/III ratio, precursor flows, and source materials are also possible without departing from the scope of the present invention. Control of interface quality is an important aspect of the process and is directly related to the flow switching capabilities of particular reactor designs. Continued optimization of the growth conditions should result in more accurate compositional and thickness control of the semipolar thin films and heterostructures described above.

Additional impurities or dopants can also be incorporated into the semipolar nitride films, heterostructures, or devices described in this invention. For example, Fe, Mg, and Si are frequently added to various layers in nitride heterostructures to alter the conduction properties of those and adjacent layers. The use of such dopants and others not listed here are within the scope of the invention.

The preferred embodiment involves first growing a semipolar template by HVPE and then growing semipolar (Ga,Al,In,B)N thin films and heterostructures by MOCVD. However, different growth methods and sequences could be used in alternative embodiments of the present invention. Other potential growth methods include HVPE, MOCVD, MBE, LPE, CBE, PECVD, sublimation, and sputtering. The flow chart in FIG. 4 provides a generalized embodiment that shows how a number of different growth methods and sequences could be used for the practice of this invention.

The scope of this invention covers more than just the four semipolar GaN template orientations cited in the preferred embodiment. This idea is pertinent to all (Ga,Al,In,B)N compositions on all semipolar orientations. For instance, it is feasible to grow {10-11} AlN, InN, AlGaN, InGaN, AlInN, or AlGaInN on a miscut (100) spinel substrate. Likewise, it is also feasible to grow {20$\bar{2}$1} templates if the proper substrate is found. These examples and other possibilities still incur all of the benefits of planar semipolar films.

This invention also covers the selection of particular crystal terminations and polarities. The use of curly brackets, { }, throughout this document denotes a family of symmetry-equivalent planes. Thus, the {10$\bar{1}$2} family includes the (10$\bar{1}$2), ($\bar{1}$012), (1$\bar{1}$02), ($\bar{1}$102), (01$\bar{1}$2), and (0$\bar{1}$12) planes. All of these planes will be terminated by group III atoms, meaning that the crystal's c-axis points away from the substrate. This family of planes also includes the corresponding nitrogen terminated planes of the same indices. In other words, the {10$\bar{1}$2} family also includes the (10$\bar{1}\bar{2}$), ($\bar{1}$01$\bar{2}$), (1$\bar{1}$0$\bar{2}$) ($\bar{1}$10$\bar{2}$), (01$\bar{1}\bar{2}$), and (0$\bar{1}$1$\bar{2}$) planes. For each of these growth orientations, the crystal's c-axis will point towards the substrate. All planes within a single crystallographic family are equivalent for the purposes of this invention, though the choice of polarity can affect the behavior of the lateral growth process. In some applications it would be desirable to grow on nitrogen terminated semipolar planes, while in other cases growth on group-III terminated planes would be preferred. The termination of the semipolar plane is largely driven by substrate selection and pretreatment. Both terminations are acceptable for the practice of this invention.

Moreover, substrates other than sapphire and spinel could be used for semipolar template growth. The scope of this invention includes the growth and fabrication of semipolar (Ga,Al,In,B)N thin films, heterostructures, and devices on all possible crystallographic orientations of all possible substrates. These substrates include, but are not limited to, silicon carbide, gallium nitride, silicon, zinc oxide, boron nitride, lithium aluminate, lithium niobate, germanium, aluminum nitride, lithium gallate, partially substituted spinels, and quaternary tetragonal oxides sharing the γ-LiAlO$_2$ structure.

Furthermore, variations in semipolar (Ga,Al,In,B)N nucleation (or buffer) layers and nucleation layer growth methods are acceptable for the practice of this invention. The growth temperature, growth pressure, orientation, and composition of the nucleation layers need not match the growth temperature, growth pressure, orientation, and composition of the subsequent semipolar thin films and heterostructures. The scope of this invention includes the growth and fabrication of semipolar (Ga,Al,In,B)N thin films, heterostructures, and devices on all possible substrates using all possible nucleation layers and nucleation layer growth methods.

The semipolar (Ga,Al,In,B)N devices described above were grown on planar semipolar GaN templates. However, the scope of this invention also covers semipolar (Ga,Al,In,B)N devices grown on semipolar epitaxial laterally overgrown (ELO) templates. The ELO technique is a method of reducing the density of threading dislocations (TD) in subsequent epitaxial layers. Reducing the TD density leads to improvements in device performance. For LEDs, these improvements include increased internal quantum efficiencies and decreased reverse-bias leakage currents. For laser diodes, these improvements include increased output powers, increased internal quantum efficiencies, longer device lifetimes, and reduced threshold current densities [Ref 28]. These advantages will be pertinent to all semipolar planar thin films, heterostructures, and devices grown on semipolar ELO templates.

The preferred embodiment and the alternative embodiments presented above have discussed semipolar (Ga,Al,In,B)N thin films, heterostructures, and devices grown on a foreign substrate. Ideally, though, the substrate would be a free-standing semipolar nitride wafer having a composition lattice matched to the structure to be grown. Free-standing semipolar nitride wafers may be creating by removing a foreign substrate from a thick semipolar nitride layer, by sawing a bulk nitride ingot or boule into individual semipolar nitride wafers, or by any other possible crystal growth or wafer manufacturing technique. The scope of this invention includes the growth and fabrication of semipolar (Ga,Al,In,B)N thin films, heterostructures, and devices on all possible free-standing semipolar nitride wafers created by all possible crystal growth methods and wafer manufacturing techniques.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

Advantages and Improvements

The existing practice is to grow (Ga,Al,In,B)N thin films and heterostructures along the polar [0001] c-direction. The resulting polarization-induced electric fields and inherently large effective hole masses are detrimental to the performance of state-of-the-art nitride optoelectronic devices. The advantage of the present invention is that the growth of (Ga,Al,In,B)N thin films and heterostructures along a semipolar direction could significantly improve device performance by reducing polarization effects and effective hole masses. Prior to this invention, no means existed to grow large area semipolar nitride thin films, heterostructures, or devices.

As an illustration of the potential improvements over existing practice, the device performance of our green (~525 nm peak) semipolar LED grown on a {10-13} GaN template on {1-100} sapphire presented above is compared with the device performance of a typical commercial green spectral range (~525 nm peak) InGaN LED grown on a c-plane GaN template. The data presented below were collected from a standard commercial device encapsulated in a hemispherical epoxy dome. The total area of the active region was 300×300 µm², which was the same as the area of the active region of our green semipolar LEDs.

Figure 16:
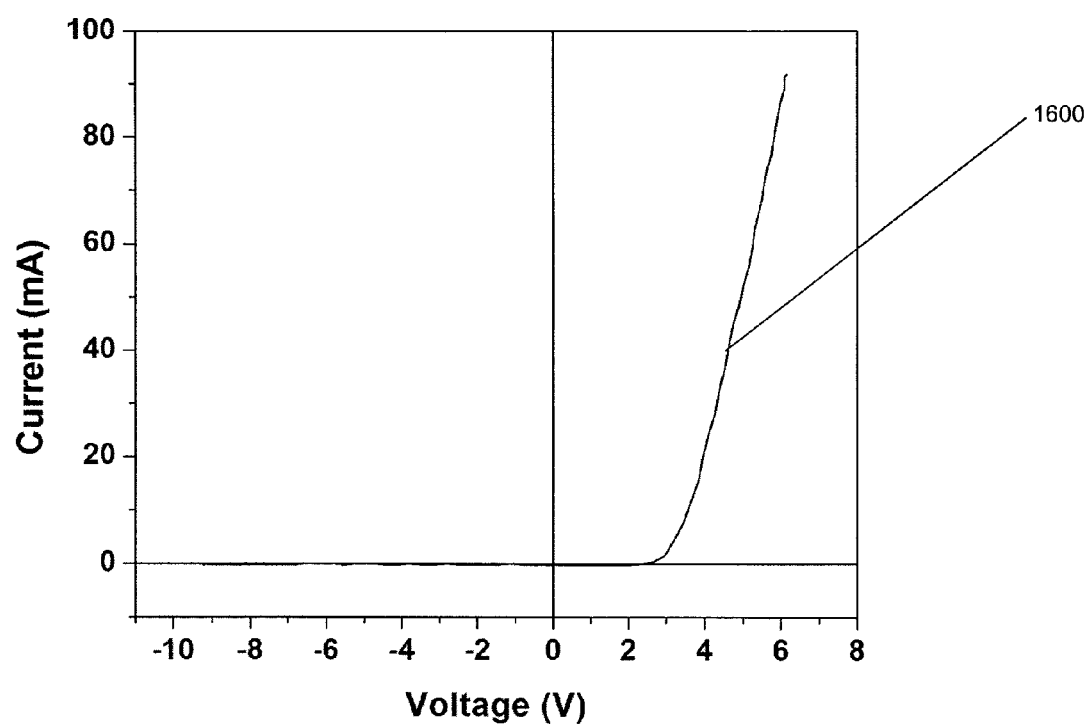
FIG. 16 is a graph of the current-voltage (I-V) characteristic of a green (~525 nm peak) commercial LED grown on a c-plane GaN template.
Figure 17:
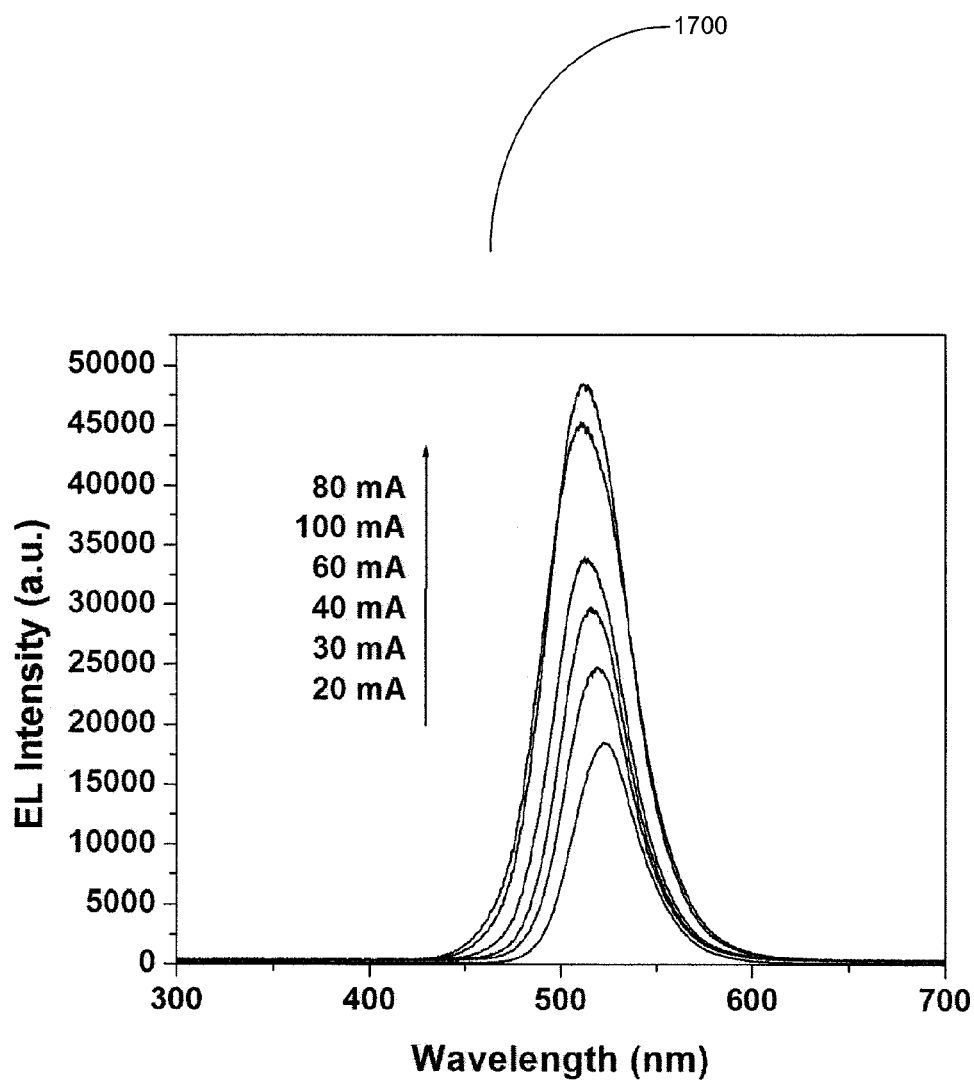
FIG. 17 is a graph of the electroluminescence (EL) spectra at different drive currents for a green (~525 nm peak) commercial LED grown on a c-plane GaN template.
Figure 19:
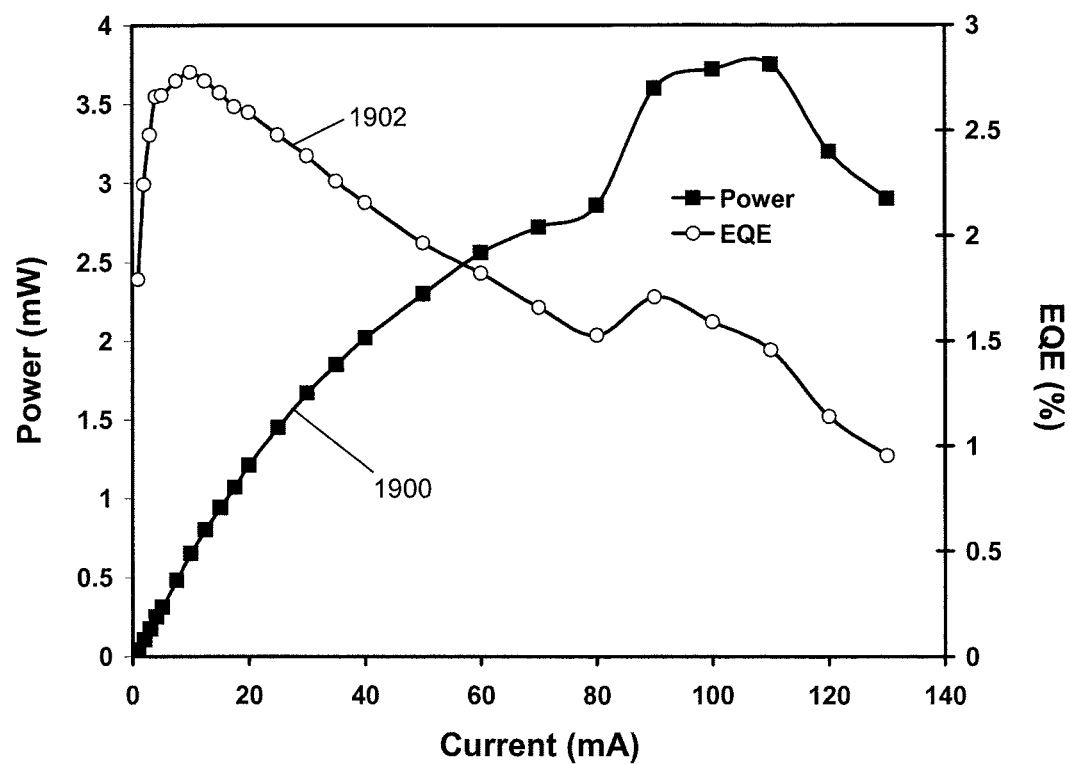
FIG. 19 is a graph of the packaged output power and external quantum efficiency (EQE) as function of drive current for a green (~525 nm peak) commercial LED grown on a c-plane GaN template.

The electrical and luminescence characteristics of the commercial LED were measured by biasing the packaged device. The I-V characteristic of the LED is shown in FIG. 16. Relative optical power measurements under direct current (dc) conditions were obtained from the top of the hemispherical epoxy dome onto a calibrated broad area Si photodiode. The EL spectra and the optical power emission of the LED were also measured as a function of drive current. This data is shown in FIGS. 17 and 19, respectively. All measurements were carried out at room temperature.

As shown in FIG. 16, the I-V characteristic 1600 of the commercial LED exhibited a turn-on voltage of 3.5 V with a series resistance of 28.9Ω. These values are larger than the values of 3.1 V and 14.3Ω for the forward voltage and series resistance, respectively, of our green semipolar LED. The difference in the turn-on voltages of the two LEDs can most likely be attributed to a decrease in the polarization-induced electric fields in the semipolar LED compared to the commercial LED. A decrease in the built-in electric fields should allow current flow in a semipolar diode for smaller separations of the n- and p-type quasi-Fermi levels, resulting in a lower turn-on voltage.

Figure 18:
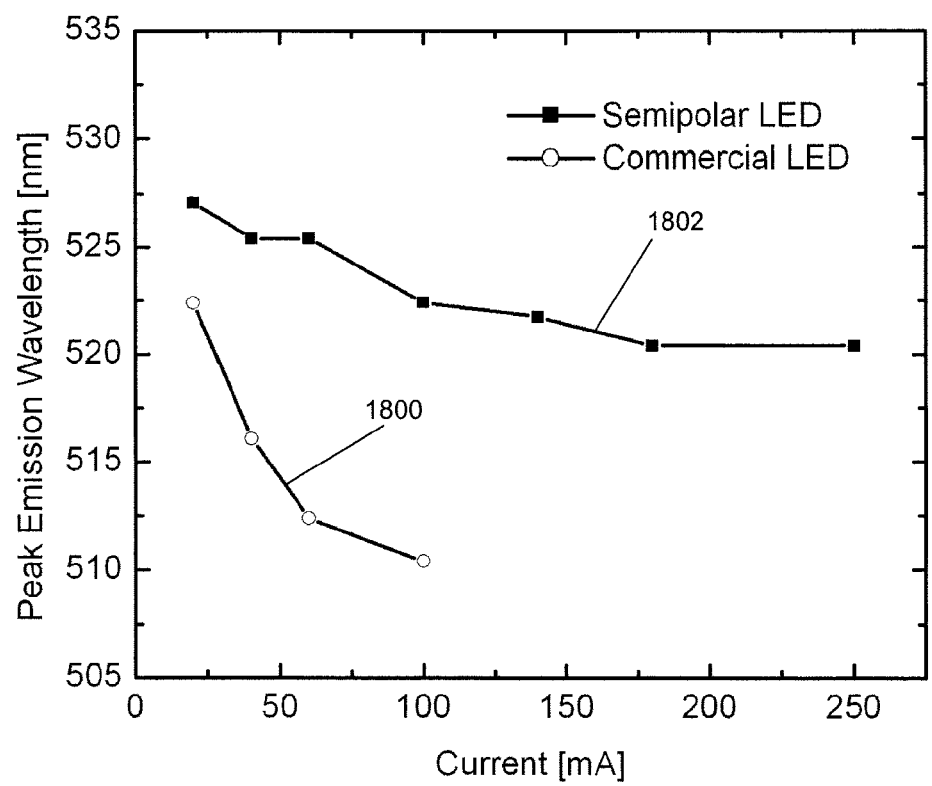
FIG. 18 is a graph comparing peak electroluminescence (EL) wavelength at different drive currents for a green (~525 nm peak) LED grown on a {10$\bar{1}$3} semipolar GaN template and a green (~525 nm peak) commercial LED grown on a c-plane GaN template.

As shown in FIG. 17, the EL spectra 1700 of the commercial LED were also measured at drive currents ranging from 20 to 100 mA. The shift in peak EL as function of drive current is compared for the green commercial LED and our green semipolar LED. As shown in FIG. 18, the commercial device wavelength graph 1800 shifted from 523 nm at 20 mA to 511 nm at 100 mA, spanning a total of 12 nm over 80 mA. Compared to the commercial device, the green semipolar LED wavelength graph 1802 shifted from 528 nm at 20 mA to 522 nm at 250 mA, spanning a total of 6 nm over 230 mA. The decrease in the blue-shift of the emission peak with increasing drive current for the semipolar LED can be attributed to a decrease in the polarization-induced electric fields in the active region of the semipolar LED compared to the commercial LED.

Relative optical output power and external quantum efficiency were also measured for the commercial LED as a function of the dc drive current. The optical power measurements were obtained from the top of the hemispherical epoxy dome onto a calibrated broad area Si photodiode. Such power measurements were intended to provide a measure of the relative output power as function of the drive current, not a measure of the total output power emitted from the commercial LED. As depicted in FIG. 19, the output power 1900 increased sublinearly as the drive current was increased from 10 mA to 130 mA, showing an anomalous jump at 90 mA probably due to heating effects. At 110 mA, the output power saturated, dropping in magnitude at higher current levels until the device died at 140 mA due to heating effects.

Unlike the semipolar LED, the EQE 1902 for the commercial LED peaked at a very low drive current of 10 mA and then diminished significantly at higher drive currents. As shown in FIG. 19, the EQE 1902 of the commercial LED decreased by 65.7% between 10 mA and 130 mA. Comparatively, as shown in FIG. 12, the EQE of the semipolar LED peaked at a relatively high drive current of 120 mA, and then decreased by only about 8% as the drive current was increased beyond 120 mA. The absence of a significant decrease in the EQE with increasing drive currents for our semipolar LEDs is in contrast to the commonly observed phenomenon of a significant decrease in the EQE of commercial c-plane LEDs working at this wavelength range and similar drive current range. The mechanism behind such a considerable difference in the EQE-I characteristics of our semipolar LEDs and commercial LEDs is unknown at present, although it can speculated that it may be related to the reduction in the polarization-induced electric fields of semipolar LEDs compared to commercial c-plane LEDs.

Finally, commercial c-plane nitride LEDs do not exhibit any degree of polarization anisotropy in their electroluminescence. Non-polar m-plane nitride LEDs, on the other hand, have demonstrated strong polarization anisotropy along the [0001] axis [Ref 15]. This polarization can be attributed to anisotropic strain-induced splitting of the heavy hole and light hole bands in compressively strained m-plane $In_xGa_{1-x}N$ quantum wells. Likewise, for general crystal growth orientations, anisotropic strain-induced splitting of the heavy hole and light hole bands should lead to significant disparities in the x'-polarized and y'-polarized optical matrix elements [Ref 9]. Thus, the optical emission of semipolar nitride optoelectronic devices should also show significant polarization anisotropy.

The above discussion involves a comparison of semipolar (Ga,Al,In,B)N thin films, heterostructures, and devices with commercially available c-plane (Ga,Al,In,B)N thin films, heterostructures, and devices. An analogous comparison can also be made with nonpolar (Ga,Al,In,B)N thin films, heterostructures, and devices. Like semipolar thin films and heterostructures, nonpolar thin films and heterostructures can be used to improve device performance by decreasing polarization effects and effective hole masses. However, high quality nonpolar templates, thin films, and heterostructures are quite difficult to grow, so nonpolar devices are not currently in production. One advantage of semipolar thin films and heterostructures over nonpolar thin films and heterostructures is the ease of crystal growth. The present invention discloses semipolar thin films and heterostructures that have a larger parameter space in which they will grow than nonpolar thin films and heterostructures. For instance, nonpolar thin films and heterostructures will not grow at atmospheric pressure, while semipolar thin films and heterostructures have been experimentally demonstrated to grow from 62.5 Torr to 760 Torr, with potentially an even wider range than that. Thus, unlike nonpolar thin films and heterostructures, semipolar (Ga,Al,In,B)N thin films and heterostructures have shown relatively little correlation between growth pressure and crystal quality.

Another advantage of semipolar planes over non-polar planes is improvement in indium incorporation efficiency. Low indium incorporation efficiency in non-polar a-plane $In_xGa_{1-x}N$ thin films was a serious issue for the growth of optoelectronic devices on a-plane GaN templates [Ref 12]. As discussed above, our data suggests that the indium incorporation efficiency in semipolar $In_xGa_{1-x}N$ thin films is comparable to the indium incorporation efficiency in c-plane $In_xGa_{1-x}N$ thin films. This high indium incorporation efficiency should help extend the emission range for semipolar $In_xGa_{1-x}N$ LEDs to longer wavelengths, as already demonstrated by our green (~525 nm) LEDs grown on a {10-13}GaN template on {1-100} sapphire.

Nishizuka et al.'s recent disclosure of their {11-22} InGaN quantum wells grown on the sidewalls of patterned c-plane oriented stripes [Ref 16] provides the closest comparison to our present work. However, this method of producing semipolar thin films and heterostructures is drastically different than that of the current disclosure; it is an artifact of epitaxial lateral overgrowth (ELO). The semipolar facet is not parallel to the substrate surface and the available surface area is too small to be processed into a semipolar device.

The advantage of the present invention is that it involves the growth and fabrication of semipolar (Ga,Al,In,B)N thin films, heterostructures, and devices on appropriate substrates or templates in which a large area of the semipolar film is parallel to the substrate surface. In contrast to the micrometer-scale inclined-facet growth previously demonstrated for semipolar nitrides, this method should enable large-scale fabrication of semipolar (Ga,Al,In,B)N devices by standard lithographic methods.

The new feature of this invention is the establishment that planar semipolar (Ga,Al,In,B)N thin films, heterostructures, and devices can be grown and fabricated. This has been experimentally confirmed by the authors for (Ga,Al,In,B)N devices grown on three distinct semipolar orientations. The previously discussed advantages will be pertinent to all planar semipolar nitride thin films, heterostructures, and devices.

Process Chart

Figure 20:
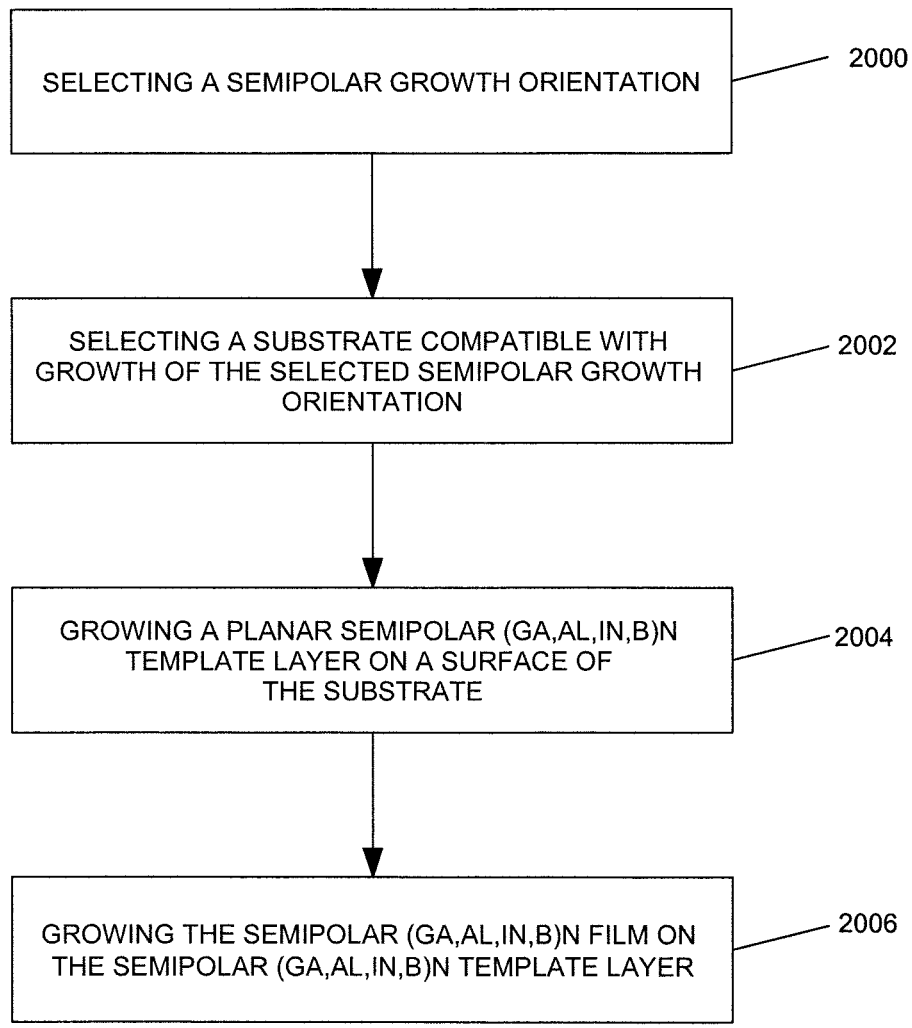
FIG. 20 illustrates a process chart in accordance with the present invention.

FIG. 20 illustrates a process chart in accordance with the present invention.

Box 2000 illustrates selecting a semipolar growth orientation.

Box 2002 illustrates selecting a substrate compatible with growth of the selected semipolar growth orientation.

Box 2004 illustrates growing a planar semipolar (Ga,Al,In,B)N template layer on a surface of the substrate.

Box 2006 illustrates growing the semipolar (Ga,Al,In,B)N film on the semipolar (Ga,Al,In,B)N template layer.

REFERENCES

The following references are incorporated by reference herein:
1. T. Takeuchi, S. Sota, M. Katsuragawa, M. Komori, H. Takeuchi, H. Amano, and I. Akasaki, Jpn. J. Appl. Phys., 36, L382 (1997).
2. P. Lefebvre, A. Morel, M. Gallart, T. Taliercio, J. Allegre, B. Gil, H. Mathieu, B. Damilano, N. Grandjean, and J. Massies, Appl. Phys. Lett., 78, 1252 (2001).
3. N. Grandjean, B. Damilano, S. Dalmasso, M. Leroux, M. Laugt, and J. Massies, J. Appl. Phys., 86, 3714 (1999).
4. J. S. Im, H. Kollmer, J. Off, A. Sohmer, F. Scholz, and A. Hangleiter, Phys. Rev. B, 57, R9435 (1998).
5. A. Di Carlo, F. Della Sala, P. Lugli, V. Fiorentini, and F. Bernardini, Appl. Phys. Lett., 76, 3950 (2000).
6. F. Della Sala, A. Di Carlo, P. Lugli, F. Bernardini, V. Fiorentini, R. Scholz, and J. M. Jancu, Appl. Phys. Lett., 74, 2002 (1999).
7. M. Suzuki and T. Uenoyama, Jpn. J. Appl. Phys., 35, 1420 (1996).
8. E. Yablonovitch and E. O. Kane, J. Lightwave Tech., 4, 504 (1986).
9. S. H. Park, J. Appl. Phys., 91, 9904 (2002).
10. A. Chakraborty, B. A. Haskell, S. Keller, J. S. Speck, S. P. DenBaars, S, Nakamura, and U. K. Mishra, Appl. Phys. Lett., 85, 5143 (2004).
11. A. Chakraborty, B. A. Haskell, S. Keller, J. S. Speck, S. P. DenBaars, S, Nakamura, and U. K. Mishra, Jpn. J. Appl. Phys., 44, L173 (2005).
12. A. Chakraborty, S. Keller, C. Meier, B. A. Haskell, S. Keller, P. Waltereit, S. P. DenBaars, S, Nakamura, J. S. Speck J S, and U. K. Mishra, Appl. Phys. Lett., 86, 031901 (2005).
13. Y. J. Sun, O. Brandt, S. Cronenberg, S. Dhar, H. T. Grahn, K. H. Ploog, P. Waltereit, and J. S. Speck, Phys. Rev. B, 67, 041306 (2003).
14. A. Chitnis, C. Chen, V. Adivarahan, M. Shatalov, E. Kuokstis, V. Mandavilli, J. Yang, and M. A. Khan, Appl. Phys. Lett., 84, 3663 (2004).
15. N. F. Gardner, J. C. Kim, J. J. Wierer, Y. C. Shen, and M. R. Krames, Appl. Phys. Lett., 86, 111101 (2005).
16. K. Nishizuka, M. Funato, Y. Kawakami, S. Fujita, Y. Narukawa, and T. Mukai, Appl. Phys. Lett., 85, 3122 (2004).
17. S. H. Park, Jpn. J. Appl. Phys, 42, L170 (2003).
18. S. H. Park, Jpn. J. Appl. Phys., 42, 5052 (2003).
19. S. H. Park and S. L. Chuang, Phys. Rev. B, 59, 4725 (1999).
20. T. Takeuchi, H. Amano, and I. Akasaki, Jpn. J. Appl. Phys., 39, 413 (2000).
21. T. Takeuchi, C. Wetzel, S. Yamaguchi, H. Sakai, H. Amano, I. Akasaki, Y. Kaneko, S, Nakagawa, Y. Yamaoka, and N. Yamada, Appl. Phys. Lett., 73, 1691 (1998).
22. F. Bernardini, V. Fiorentini, D. Vanderbilt, Phys. Rev. B, 56, R10024 (1997).
23. Polian, M. Grimsditch, I. Grzegory, J. Appl. Phys., 79, 3343 (1996).
24. K. Kim, W. R. L. Lambrecht, and B. Segall, Phys Rev. B, 53, 16310 (1996).
25. I. Vurgaftman and J. R. Meyer, J. Appl. Phys., 94, 3675 (2003).
26. F. Bertram, T. Riemann, J. Christen, A. Kaschner, A. Hoffmann, C. Thomsen, K. Hiramatsu, T. Shibata, and N. Sawaki, Appl. Phys. Lett., 74, 359 (1999).
27. H. Sone, S, Nambu, Y. Kawaguchi, M. Yamaguchi, H. Miyake, K. Hiramatsu, Y. Iyechika, T. Maeda, and N. Sawaki, Jpn. J. Appl. Phys., 38, L356 (1999).
28. S, Nakamura, M. Senoh, S, Nagahama, N. Iwasa, T. Yamada, T. Matsushita, H. Kiyoku, Y. Sugimoto, T. Kozaki, H. Umemoto, M. Sano, and K. Chocho, Appl. Phys. Lett., 72, 211 (1998).
29. S, Nakamura and G. Fasol, The Blue Laser Diode, (Springer, Heidelberg, 1997). This book provides an overview of c-plane (Ga,Al,In,B)N optoelectronics technology.
30. L. Coldren and S. Corzine, Diode Lasers and Photonic Integrated Circuits, (Wiley Interscience, New York, 1995). Chapters 4 and Appendices 8-11 provide theory relevant to the design of strained quantum well lasers.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching, without fundamentally deviating from the essence of the present invention. It is intended that the scope of the invention be limited not by this detailed description, but rather by the claims appended hereto.

What is claimed is:

1. A light emitting device configured as a laser device, comprising:
   a semipolar III-nitride film including a light emitting device structure, wherein:
      the light emitting device structure includes one or more semipolar III-nitride active layers grown on or above a semipolar surface of a substrate comprising a free-standing gallium nitride (GaN) substrate, the semipolar surface having a {20-21} orientation or off-cut thereof, and
      one or more material properties of the semipolar III-nitride active layers are such that the device has an output power of at least 1.5 milliwatts at 250 milliamps drive current; and
   an edge configured on the light emitting device structure for emission of electromagnetic radiation.

2. The device of claim 1, wherein the semipolar III-nitride film comprises a gallium and nitrogen material.

3. The device of claim 1, wherein the device structure comprises a green light emitting semipolar diode.

4. The device of claim 1, wherein the substrate is grown on a foreign material.

5. The device of claim 1, wherein the semipolar III-nitride active layers form a heterostructure.

6. The device of claim 1, wherein the semipolar III-nitride active layers emit light with reduced blue-shift in a blue emission peak with increasing drive current density between at least 33 Amps per centimeter square and at least 222 Amps per centimeter square, as compared to polar III-nitride active layers operating in similar wavelength and drive current density ranges.

7. The device of claim 1, wherein the semipolar III-nitride active layers emit light with a reduced decrease in the external quantum efficiency (EQE) with increasing drive current density, as compared to polar III-nitride active layers operating in similar wavelength and drive current density ranges.

8. The device of claim 1, wherein the semipolar III-nitride active layers have reduced polarization effects and effective hole masses, as compared to polar III-nitride active layers operating in similar wavelength and drive current density ranges.

9. The device of claim 1, wherein the device structure comprises a blue light emitting semipolar diode.

10. The device of claim 1, wherein a top surface of the semipolar III-nitride active layers is planar, semipolar, and substantially parallel to a main surface of the substrate.

11. A method for fabricating a laser device, comprising:
   growing a semipolar III-nitride film including a light emitting laser device structure, wherein:
      the light emitting laser device structure includes one or more semipolar III-nitride active layers grown on or above a surface of a nitride substrate comprising a free-standing gallium nitride (GaN) substrate having a {20-21} surface orientation or off-cut thereof, and
      the semipolar III-nitride active layers have one or more material properties such that the device has an output power of at least 1.5 milliwatts at 250 milliamps drive current; and
   forming an edge on the laser device structure for emission of electromagnetic radiation.

12. The method of claim 11, wherein the light emitting device structure comprises a green light emitting semipolar diode.

13. The method of claim 11, wherein the nitride substrate is grown using MOCVD on a foreign material.

14. The method of claim 11, wherein the semipolar III-nitride active layers form a heterostructure.

15. The method of claim 11, wherein the semipolar III-nitride active layers emit light with a reduced blue-shift in a blue emission peak with increasing drive current density between at least 33 Amps per centimeter square and at least 222 Amps per centimeter square, as compared to polar III-nitride active layers operating in similar wavelength and drive current density ranges.

16. The method of claim 11, wherein the semipolar III-nitride active layers emit light with a reduced decrease in the external quantum efficiency (EQE) with increasing drive current density, as compared to polar III-nitride active layers operating in similar wavelength and drive current density ranges.

17. The method of claim 11, wherein the semipolar III-nitride active layers have reduced polarization effects and effective hole masses, as compared to polar III-nitride active layers operating in similar wavelength and drive current density ranges.

18. The method of claim 11, wherein the light emitting device structure comprises a blue light emitting semipolar diode.

19. The method of claim 11, wherein:
   a top surface of the semipolar III-nitride active layers is planar, semipolar, and substantially parallel to a semipolar surface of the nitride substrate comprising a nitride template layer, and
   the top surface has a surface area of at least 300 micrometers by 300 micrometers.

20. The method of claim 11, wherein the semipolar III-nitride active layers are grown on or above a semipolar surface of a gallium nitride (GaN) template having a thickness of at least 10 micrometers.

21. A light emitting device configured as a laser device, comprising:
   a semipolar III-nitride film including a light emitting device structure, wherein:
      the light emitting device structure includes one or more semipolar III-nitride active layers grown on or above a surface of a substrate, and
      one or more material properties of the semipolar III-nitride active layers are such that the device has an output power of at least 1.5 milliwatts at 250 milliamps drive current; and
   an edge configured on the light emitting device structure for emission of electromagnetic radiation;
   wherein the semipolar III-nitride active layers emit light with reduced blue-shift in a blue emission peak with increasing drive current density between at least 33 Amps per centimeter square and at least 222 Amps per centimeter square, as compared to polar III-nitride active layers operating in similar wavelength and drive current density ranges.

22. The device of claim 21, wherein the semipolar III-nitride film comprises a gallium and nitrogen material.

23. The device of claim 21, wherein the semipolar III-nitride active layers are grown on or above a semipolar surface of the substrate comprising a free-standing gallium nitride (GaN) substrate, the semipolar surface having a {20-21} orientation or offcut thereof.

24. The device of claim 21, wherein the substrate is grown on a foreign material.

25. The device of claim 21, wherein the semipolar III-nitride active layers form a heterostructure.

26. The device of claim 21, wherein the semipolar III-nitride active layers emit light with a reduced decrease in the external quantum efficiency (EQE) with increasing drive current density, as compared to polar III-nitride active layers operating in similar wavelength and drive current density ranges.

27. The device of claim 21, wherein the semipolar III-nitride active layers have reduced polarization effects and effective hole masses, as compared to polar III-nitride active layers operating in similar wavelength and drive current density ranges.

28. The device of claim 21, wherein a top surface of the semipolar III-nitride active layers is planar, semipolar, and substantially parallel to a main surface of the substrate.

29. A method for fabricating a laser device, comprising:

growing a semipolar III-nitride film including a light emitting laser device structure, wherein:

the light emitting laser device structure includes one or more semipolar III-nitride active layers grown on or above a surface of a nitride substrate, and the semipolar III-nitride active layers have one or more material properties such that the device has an output power of at least 1.5 milliwatts at 250 milliamps drive current; and forming an edge on the laser device structure for emission of electromagnetic radiation;

wherein the semipolar III-nitride active layers emit light with a reduced blue-shift in a blue emission peak with increasing drive current density between at least 33 Amps per centimeter square and at least 222 Amps per centimeter square, as compared to polar III-nitride active layers operating in similar wavelength and drive current density ranges.

30. The method of claim 29, wherein the semipolar III-nitride active layers are grown on or above a semipolar surface of the substrate comprising a free-standing gallium nitride (GaN) substrate, the semipolar surface having a {20-21} orientation or offcut thereof.

31. The method of claim 29, wherein a top surface of the semipolar III-nitride active layers is planar, semipolar, and substantially parallel to a main surface of the substrate.

* * * * *